United States Patent
Lai et al.

(10) Patent No.: US 11,915,979 B2
(45) Date of Patent: Feb. 27, 2024

(54) GATE STRUCTURES IN SEMICONDUCTOR DEVICES

(71) Applicant: Taiwan Semiconductor Manufacturing Co., Ltd., Hsinchu (TW)

(72) Inventors: Pei Ying Lai, Hsinchu (TW); Chia-Wei Hsu, Taipei (TW); Cheng-Hao Hou, Hsinchu (TW); Xiong-Fei Yu, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/869,326

(22) Filed: Jul. 20, 2022

(65) Prior Publication Data

US 2022/0367279 A1 Nov. 17, 2022

Related U.S. Application Data

(62) Division of application No. 16/733,959, filed on Jan. 3, 2020.

(60) Provisional application No. 62/908,137, filed on Sep. 30, 2019.

(51) Int. Cl.
| | |
|---|---|
| *H01L 21/8234* | (2006.01) |
| *H01L 29/417* | (2006.01) |
| *H01L 29/66* | (2006.01) |
| *H01L 29/78* | (2006.01) |

(52) U.S. Cl.
CPC ........ *H01L 21/823431* (2013.01); *H01L 29/41791* (2013.01); *H01L 29/6681* (2013.01); *H01L 29/785* (2013.01)

(58) Field of Classification Search
CPC ....... H01L 21/823431; H01L 29/41791; H01L 29/6681; H01L 29/785
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2006/0166452 A1 | 7/2006 | Rao et al. | |

(Continued)

FOREIGN PATENT DOCUMENTS

| | | |
|---|---|---|
| KR | 20140133597 A | 11/2014 |
| KR | 20160073143 A | 6/2016 |

(Continued)

*Primary Examiner* — Shaun M Campbell
(74) *Attorney, Agent, or Firm* — Slater Matsil, LLP

(57) ABSTRACT

A method includes depositing a high-k gate dielectric layer over and along sidewalls of a semiconductor fin. The method further includes depositing an n-type work function metal layer over the high-k gate dielectric layer and performing a passivation treatment on the high-k gate dielectric layer through the n-type work function metal layer. The passivation treatment comprises a remote plasma process. The method further includes depositing a fill metal over the n-type work function metal layer to form a metal gate stack over the high-k gate dielectric layer. The metal gate stack comprising the n-type work function metal layer and the fill metal.

20 Claims, 32 Drawing Sheets

(56) References Cited

U.S. PATENT DOCUMENTS

| | | |
|---|---|---|
| 2014/0051264 A1 | 2/2014 | Mallick et al. |
| 2014/0282326 A1 | 9/2014 | Chen et al. |
| 2014/0319620 A1 | 10/2014 | Hoentschel et al. |
| 2016/0093711 A1 | 3/2016 | Hong et al. |
| 2016/0172488 A1 | 6/2016 | Oh et al. |
| 2017/0110551 A1 | 4/2017 | Lee et al. |
| 2017/0170027 A1 | 6/2017 | Hou et al. |
| 2017/0186853 A1* | 6/2017 | Zhu .................. H01L 21/823475 |
| 2019/0035916 A1* | 1/2019 | Chiu .................. H01L 21/28088 |
| 2019/0096679 A1* | 3/2019 | Kannan .................. H01L 29/785 |
| 2019/0096680 A1 | 3/2019 | Wei et al. |
| 2019/0096681 A1* | 3/2019 | Wei ........................ H01L 29/512 |
| 2019/0148539 A1 | 5/2019 | Yang et al. |
| 2019/0165173 A1 | 5/2019 | Liu et al. |
| 2019/0273147 A1 | 9/2019 | Cheng et al. |

FOREIGN PATENT DOCUMENTS

| | | |
|---|---|---|
| KR | 20190013403 A | 2/2019 |
| KR | 20190037057 A | 4/2019 |
| KR | 20190063358 A | 6/2019 |

\* cited by examiner

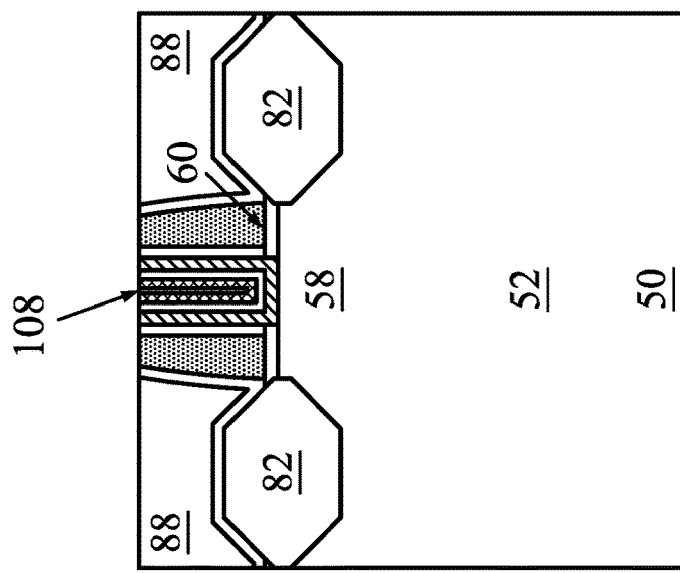
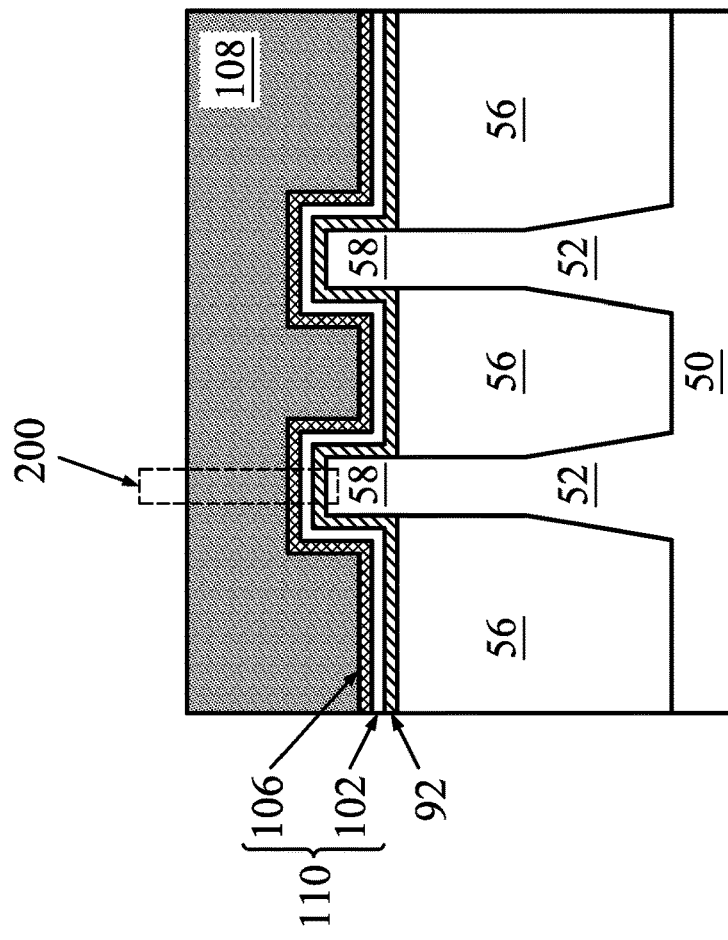
Figure 21A
Figure 21B

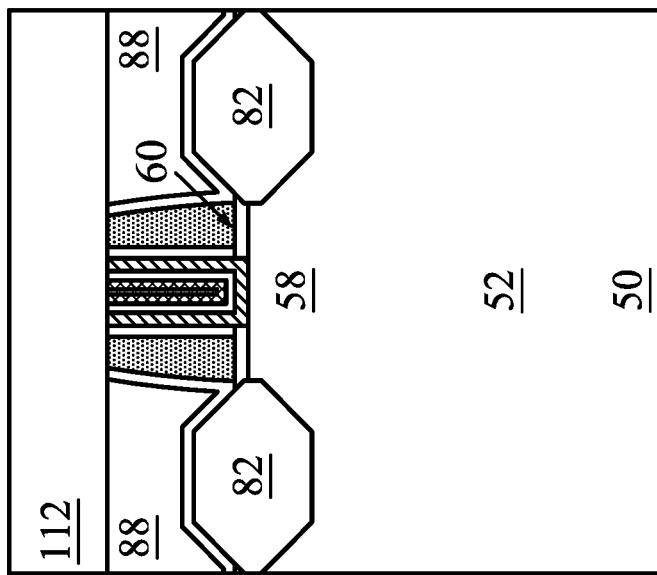
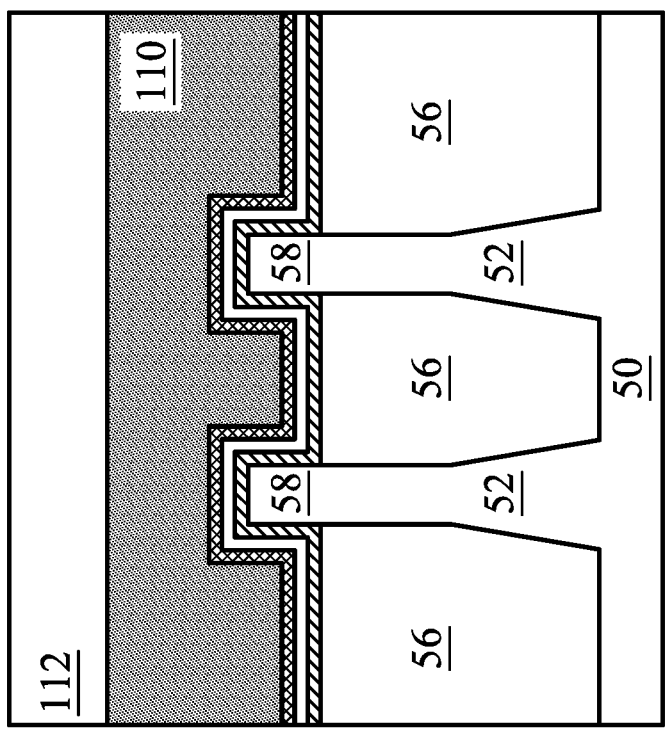
Figure 22A
Figure 22B

GATE STRUCTURES IN SEMICONDUCTOR DEVICES

PRIORITY CLAIM AND CROSS-REFERENCE

This patent is a divisional of U.S. application Ser. No. 16/733,959, filed on Jan. 3, 2020, which claims priority to U.S. Provisional Application No. 62/908,137, filed on Sep. 30, 2019, which applications are hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, 16B, 17A, 17B, 17C, 17D, 18A, 18B, 19A, 19B, 19C, 19D, 19E, 20A, 20B, 21A, 21B, 21C, 21D, 22A, 22B, 23A, and 23B are cross-sectional views of intermediate stages in the manufacturing of FinFETs, in accordance with some embodiments.

DETAILED DESCRIPTION

Figure 1:
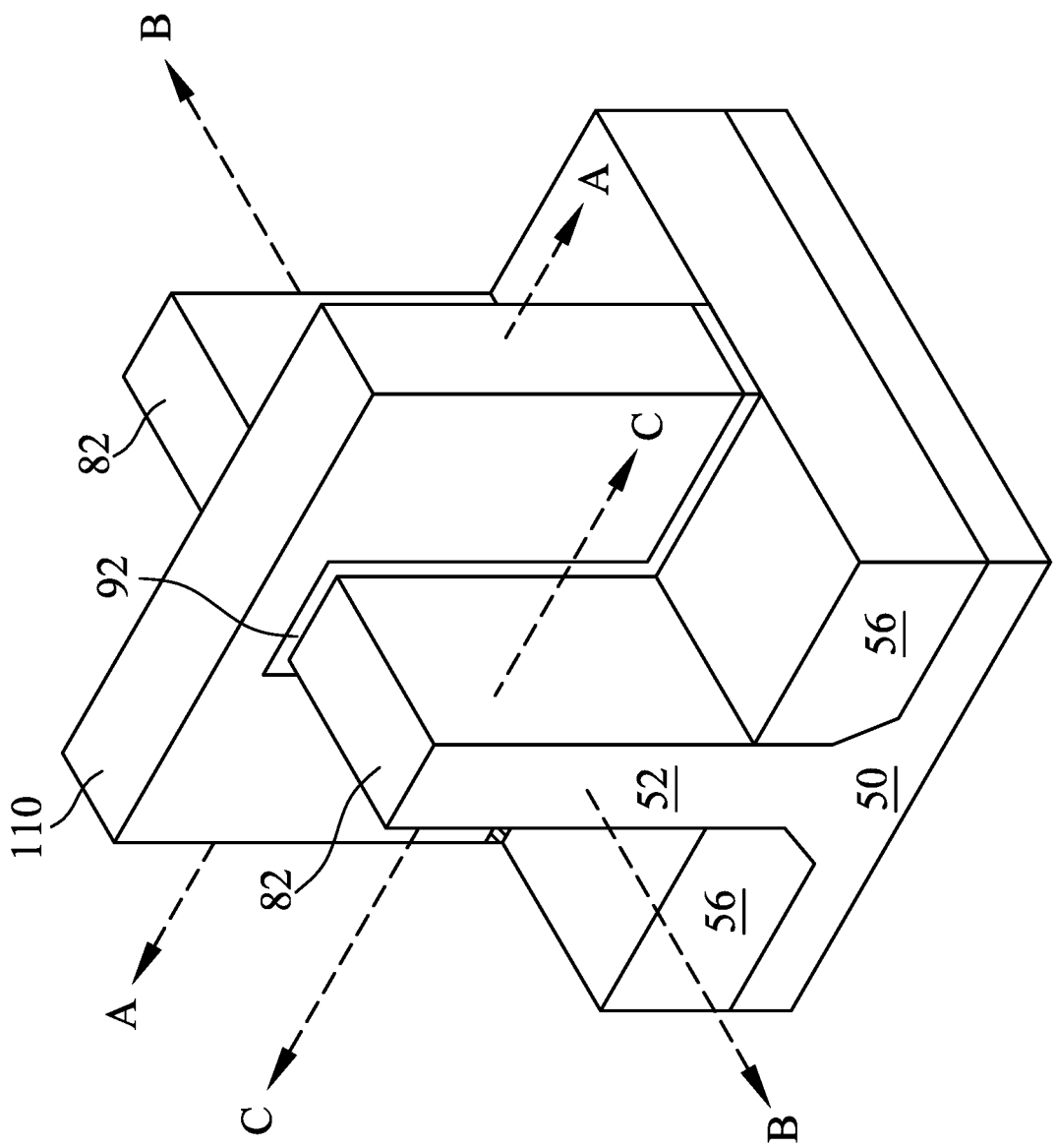
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a passivation treatment for one or more gate dielectric layers of a transistor (e.g., a fin field effect transistor (FinFET)). The passivation treatment includes introducing a passivating species (e.g., fluorine, nitrogen, or the like) into the gate dielectric layer(s) using a remote plasma process. The passivating species may be introduced in the form of radicals (e.g., fluorine radicals, nitrogen radicals, or the like). The passivating species may help fix defects (e.g., dangling bonds, oxygen vacancies, or the like) in the gate dielectric layer(s), improving device performance. In some embodiments, an n-type work function metal over the gate dielectric layer(s) may facilitate the passivation treatment by attracting the passivating species into the gate dielectric layer(s). By using a remote plasma process, improved conformity and a desired doping concentration of the passivating species can be achieved in the gate dielectric layer(s). Further, the passivation treatment may be performed at a relatively low temperature (e.g., with a low thermal budget), which reduces the risk of damage to the transistor as a result of the passivation treatment.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 110 is over the gate dielectric layer 92. Source/drain regions 82 are disposed in opposite sides of the fin 52 with respect to the gate dielectric layer 92 and gate electrode 110. FIG. 1 further illustrates reference cross-sections that are used in later figures. Cross-section A-A is along a longitudinal axis of the gate electrode 110 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 23B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, 19A, 20A, 21A, 22A, and 23A are illustrated along reference cross-section A-A illustrated in FIG. 1, and FIGS. 8B, 9B, 10B, 11B, 12B, 13B, 14B, 15B, 16B, 17B, 18B, 19B, 20B, 21B, 22B, and 23B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
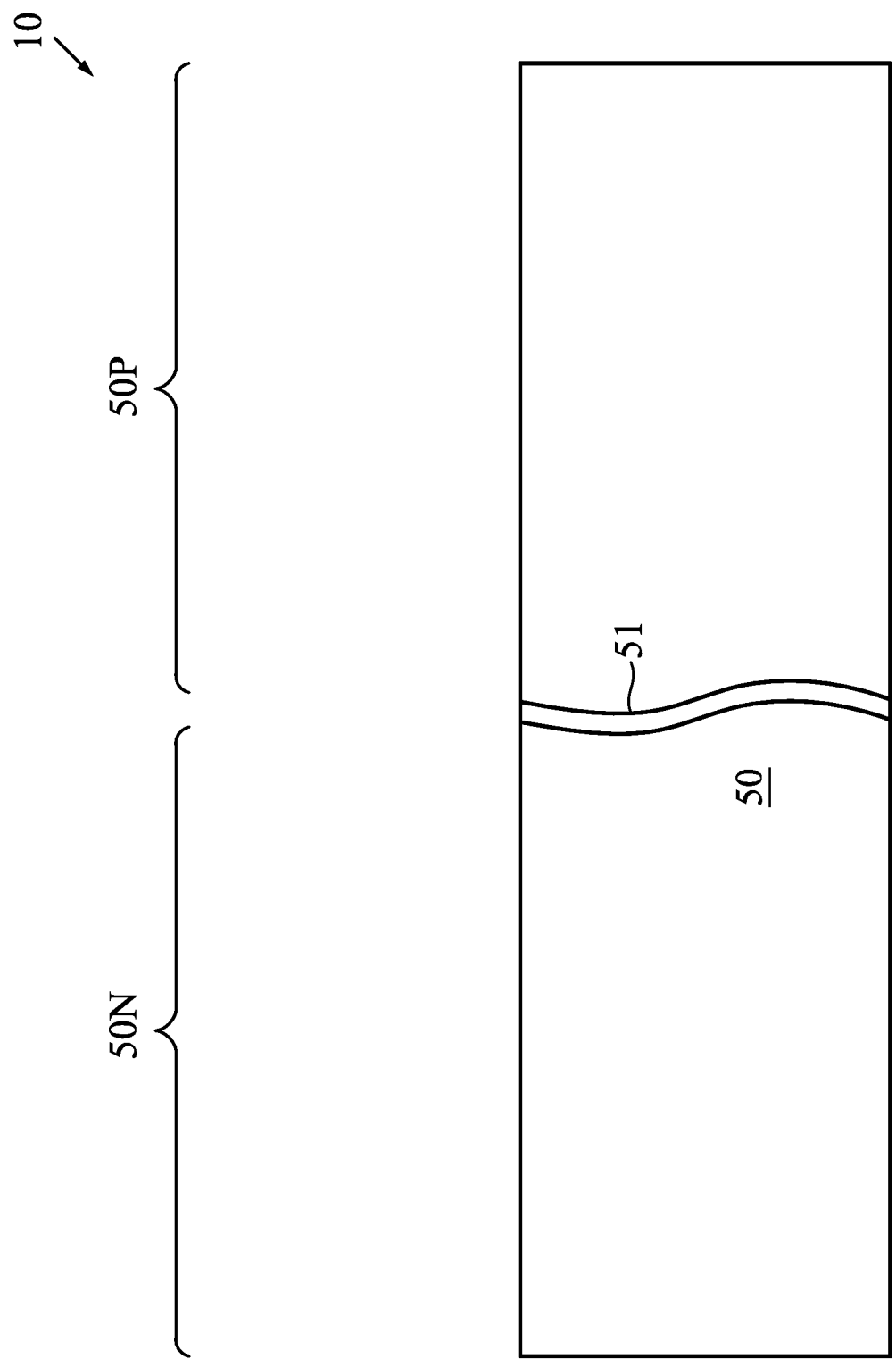

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be part of a wafer 10, which may start as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
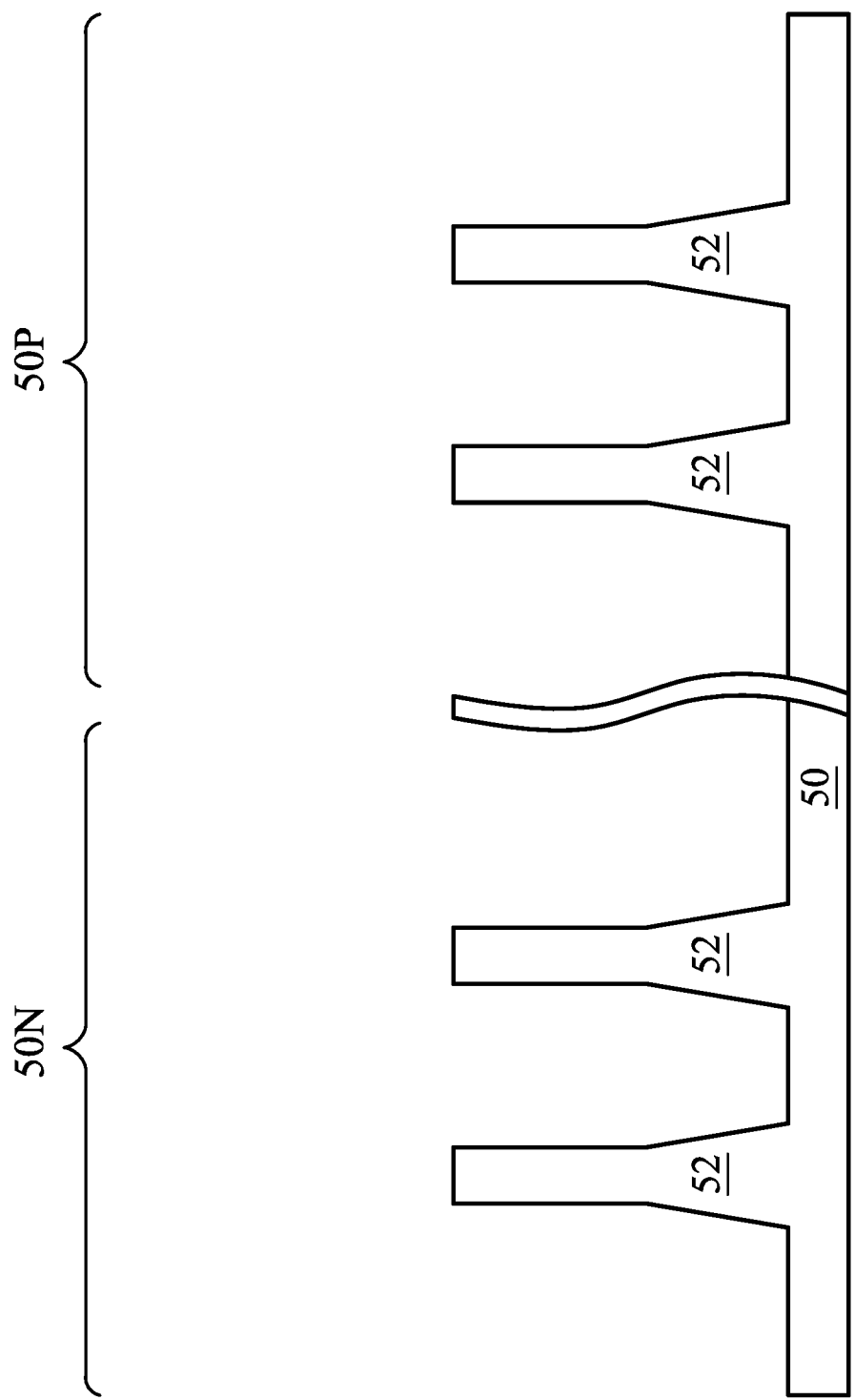

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
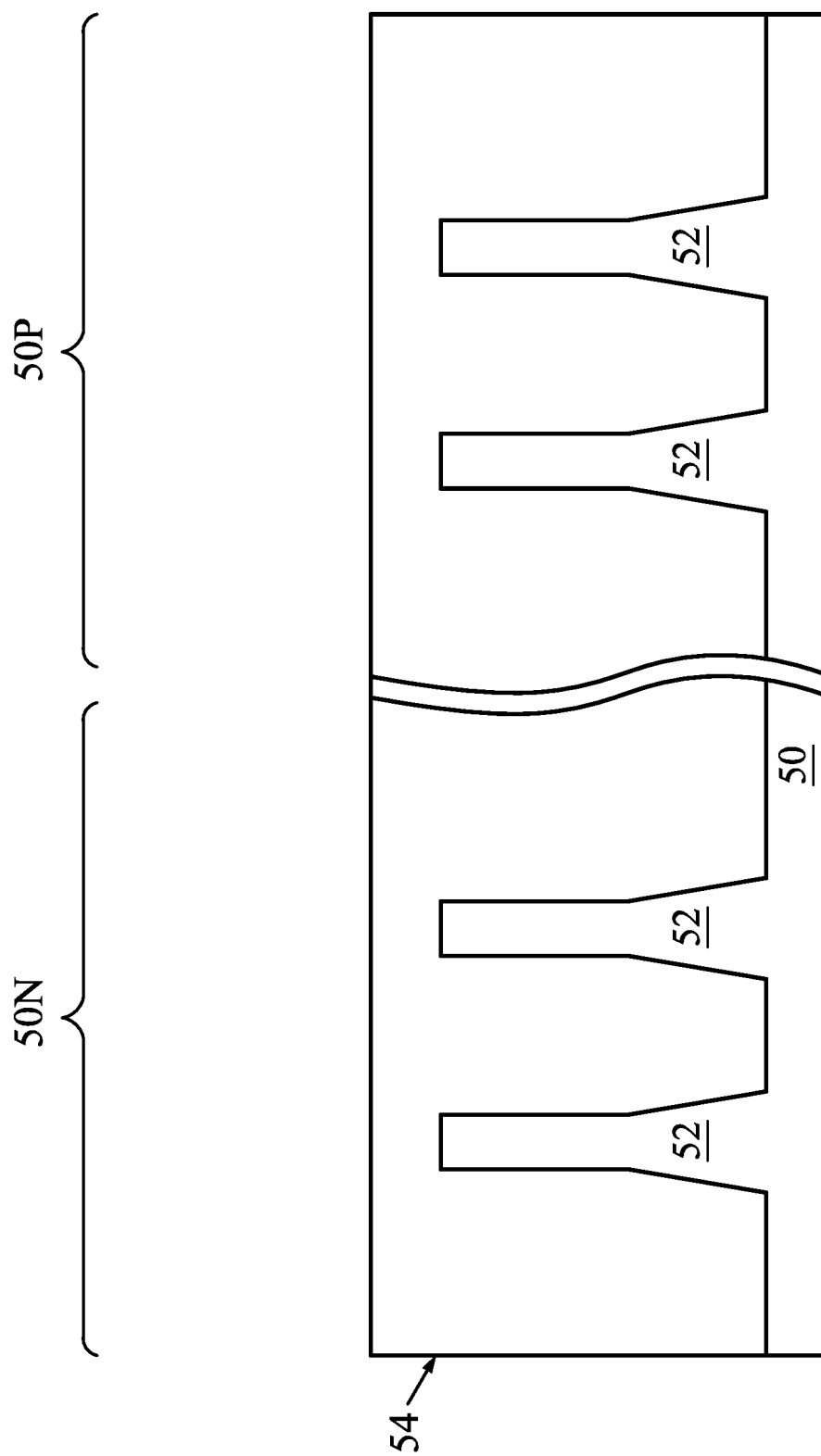

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
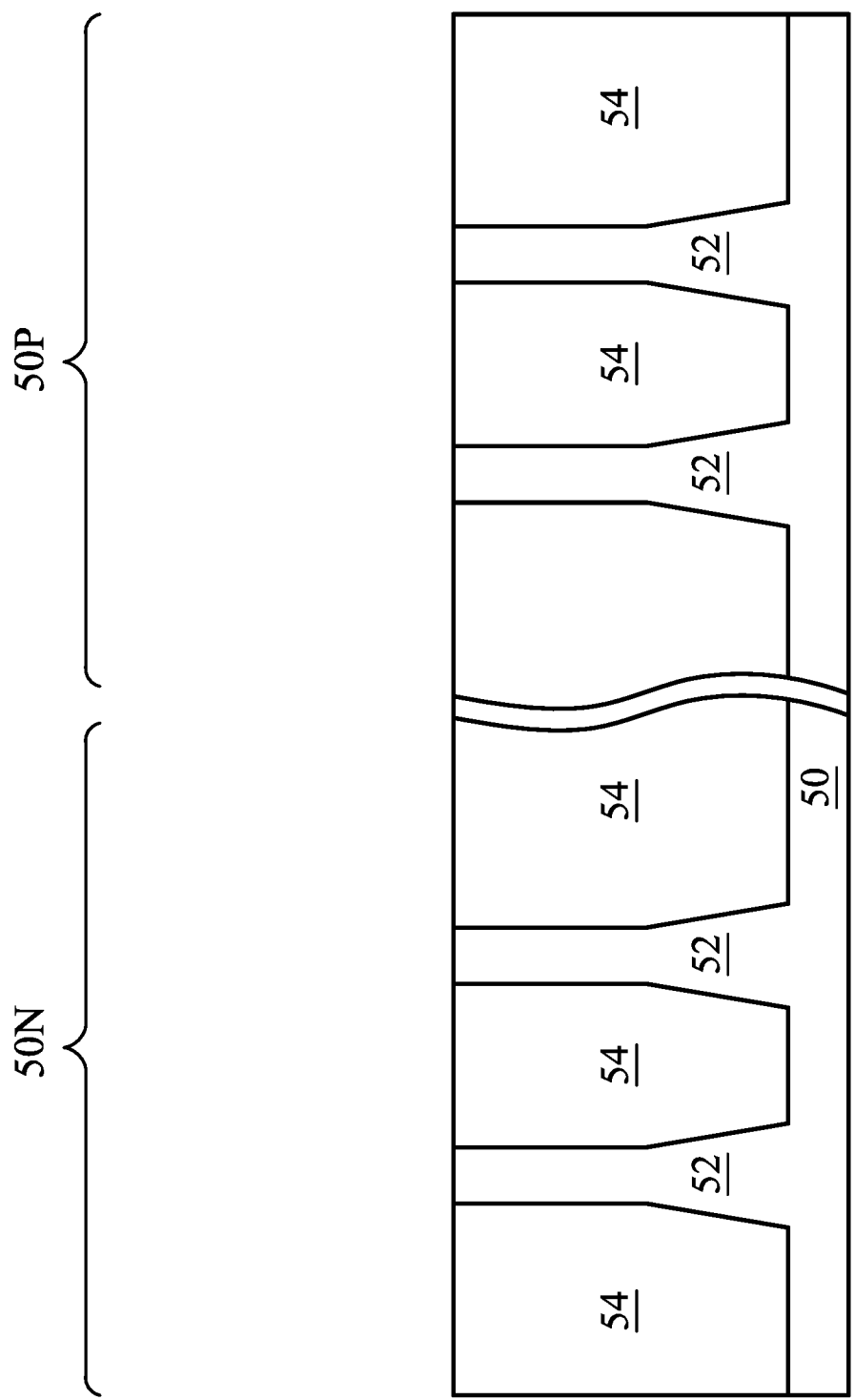

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
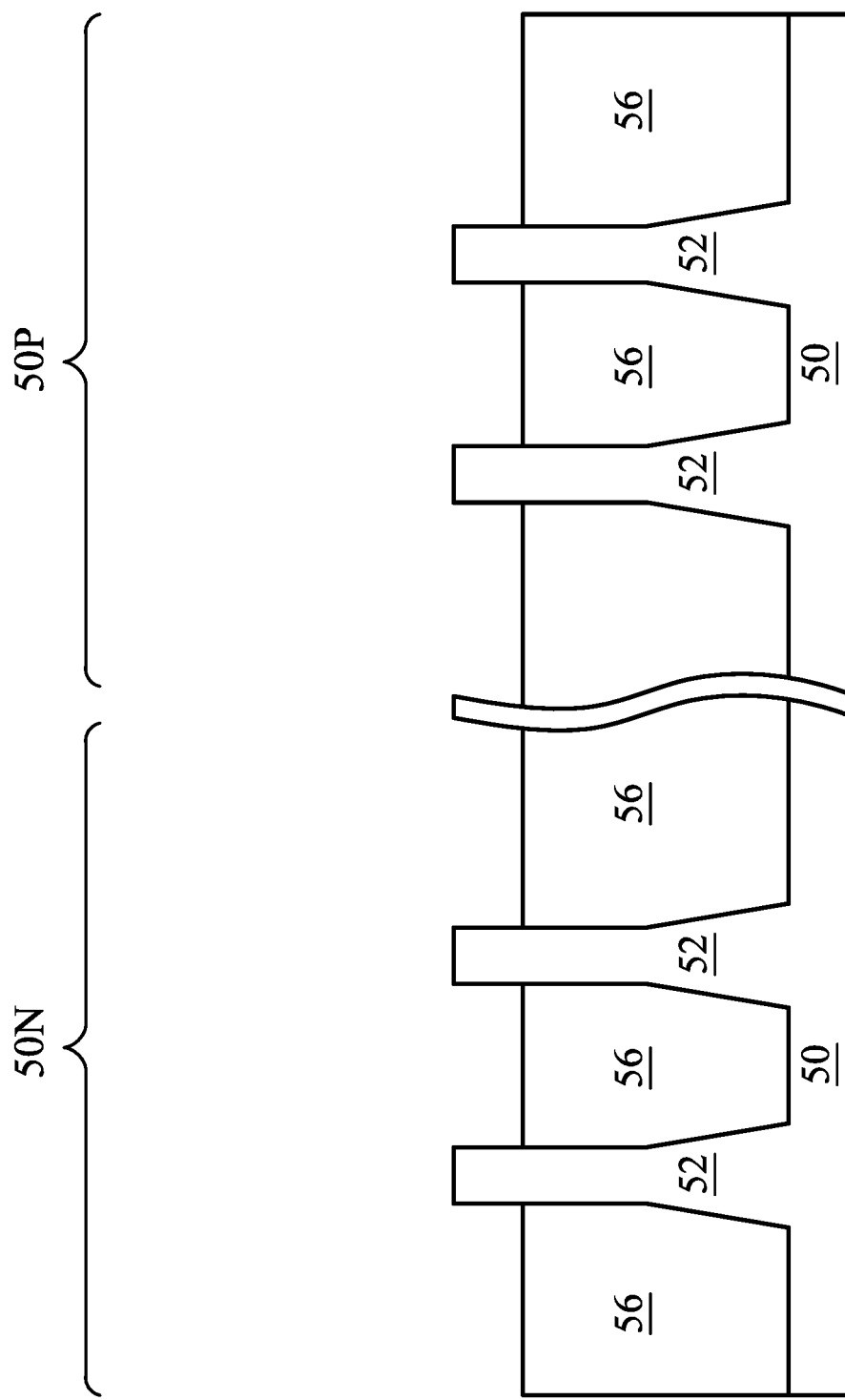

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown. The epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
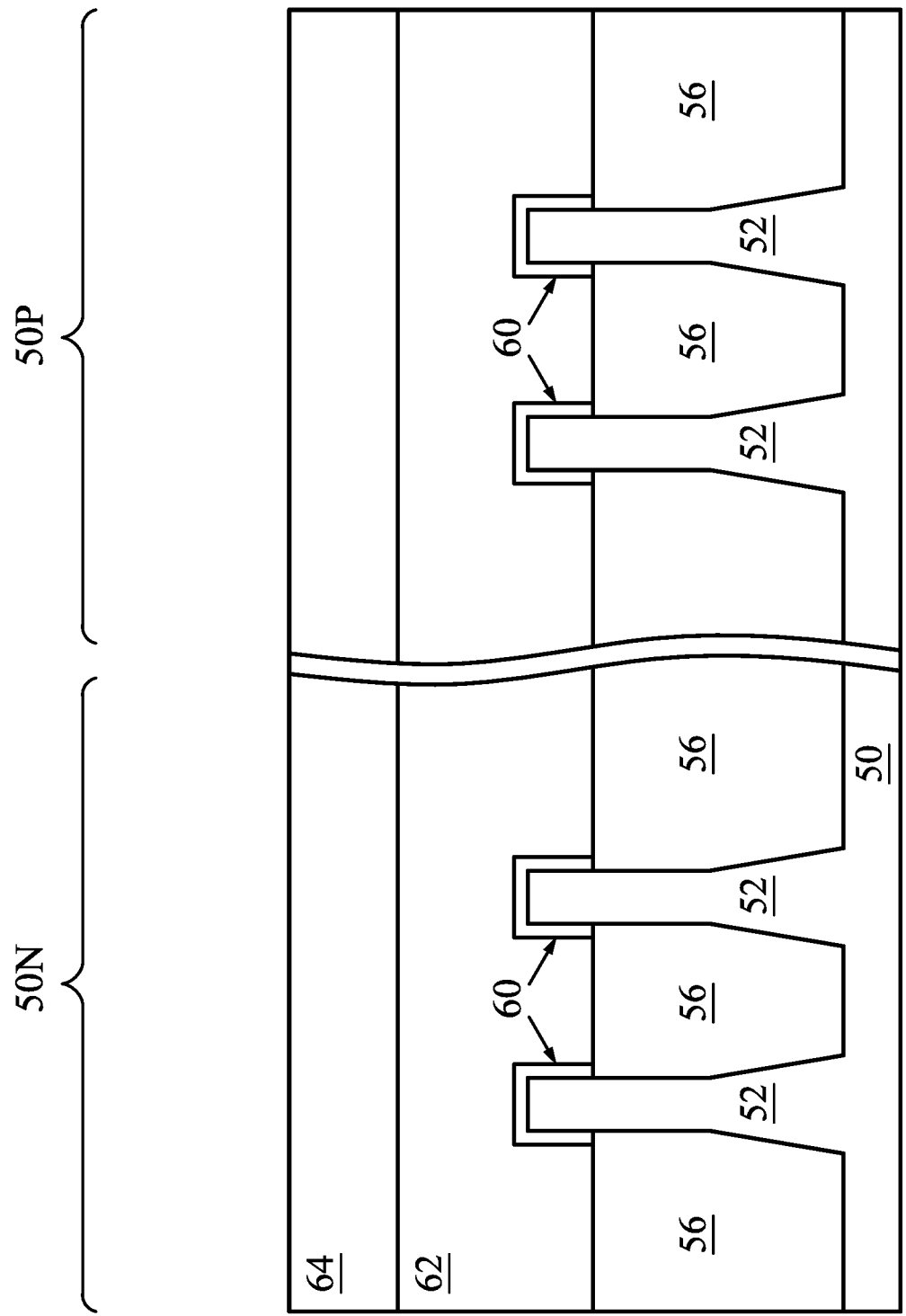

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
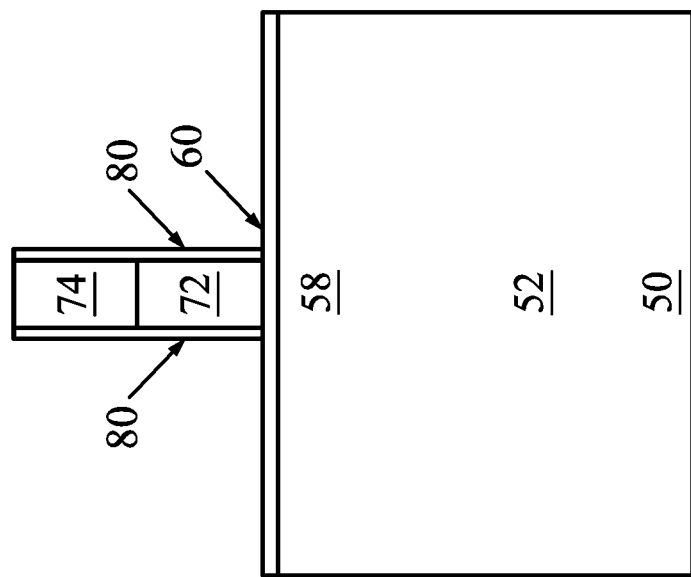
Figure 8A:
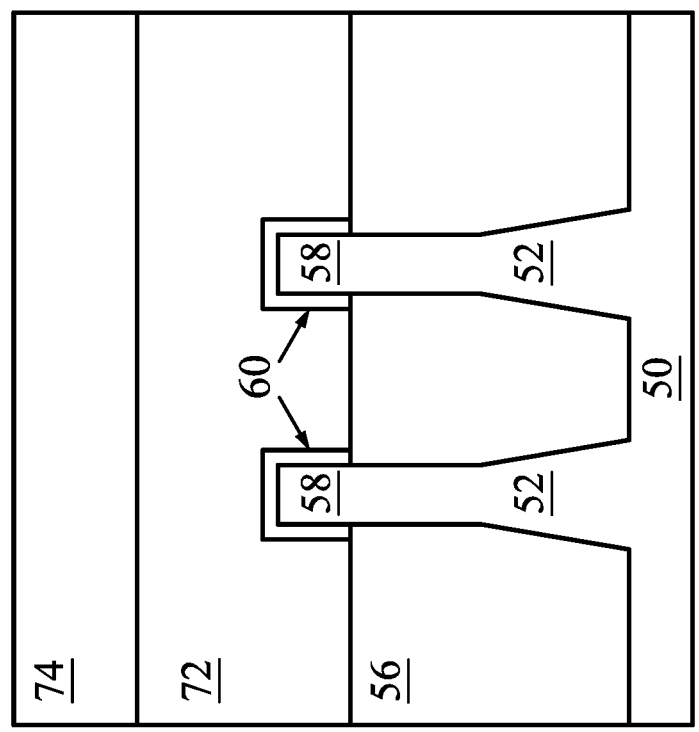

In FIGS. 8A and 8B, the mask layer 64 may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
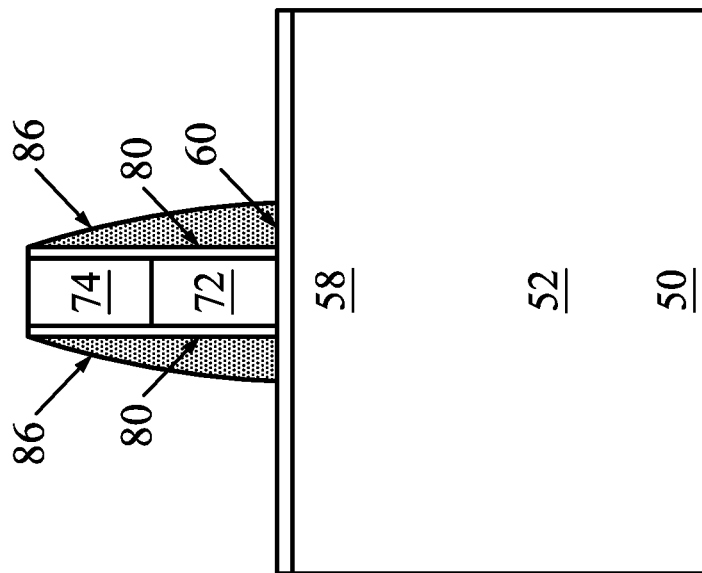
Figure 9A:
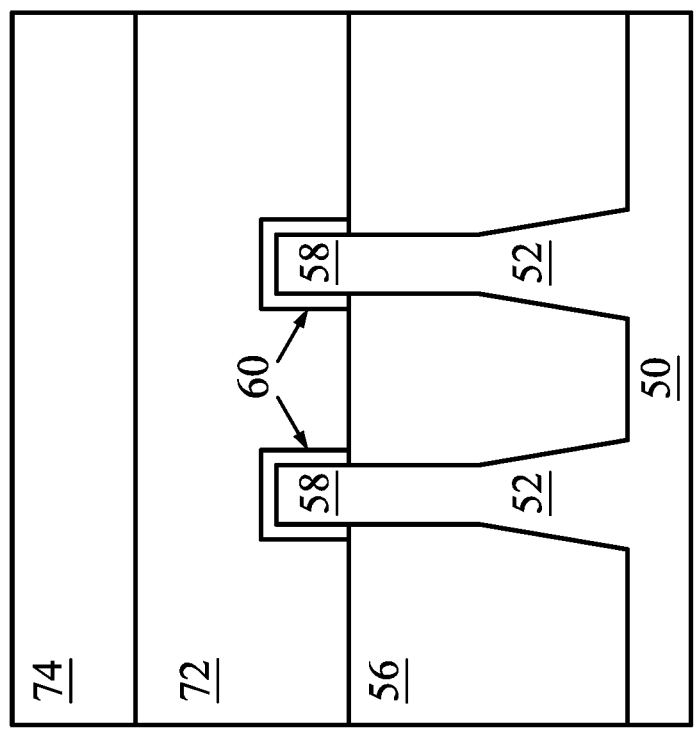

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 10B:
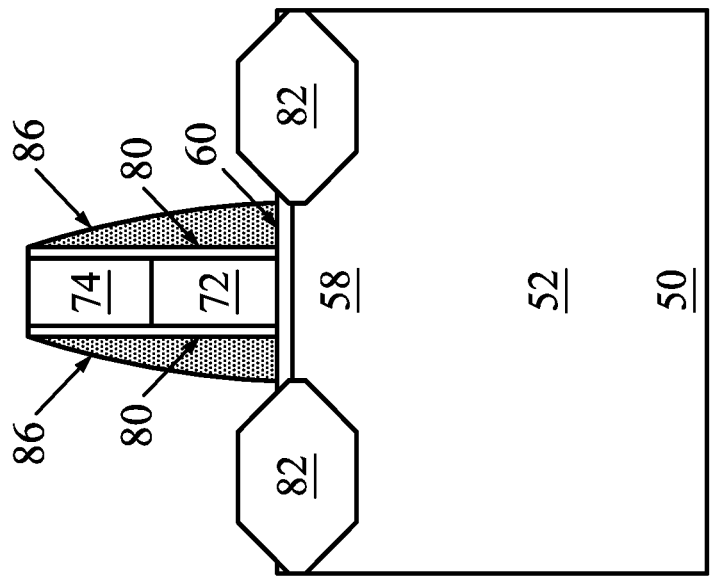
Figure 10A:
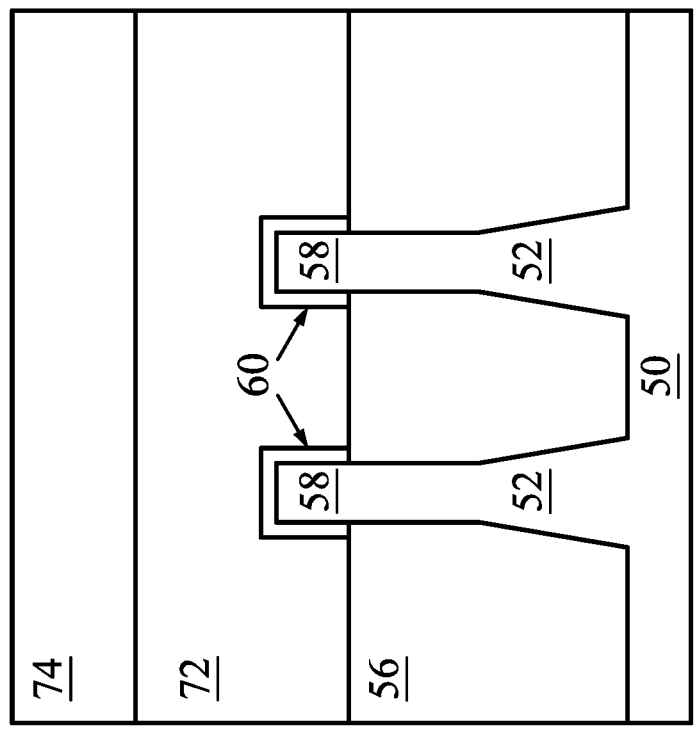
Figure 10D:
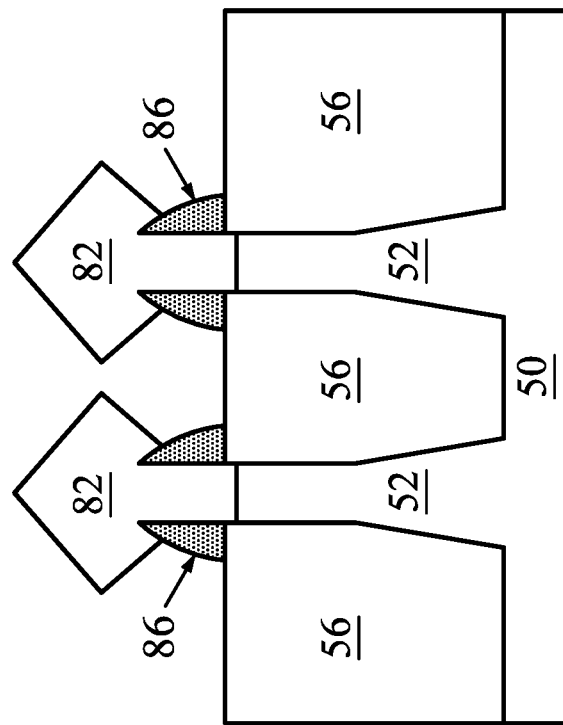
Figure 10C:
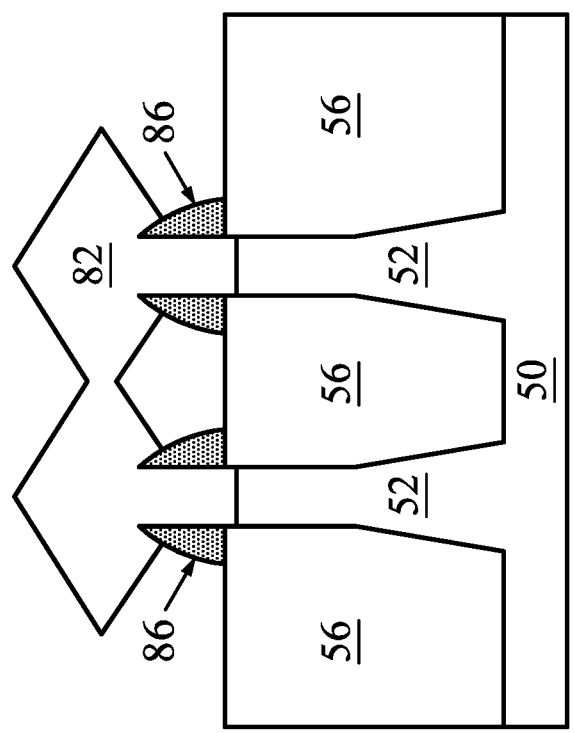

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond a sidewalls of the fins 52. In some embodiments, these facets cause adjacent source/drain regions 82 of a same finFET to merge as illustrated by FIG. 10C. In other embodiments, adjacent source/drain regions 82 remain separated after the epitaxy process is completed as illustrated by FIG. 10D.

Figure 11B:
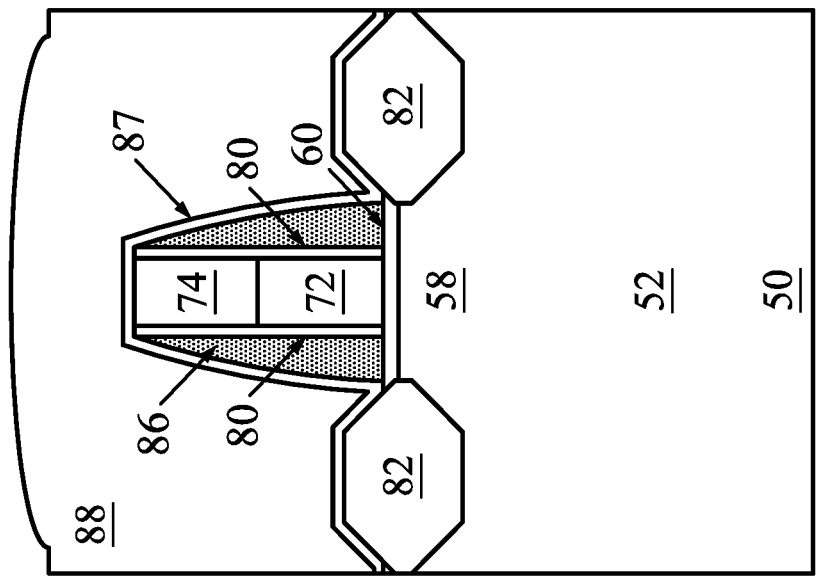
Figure 11A:
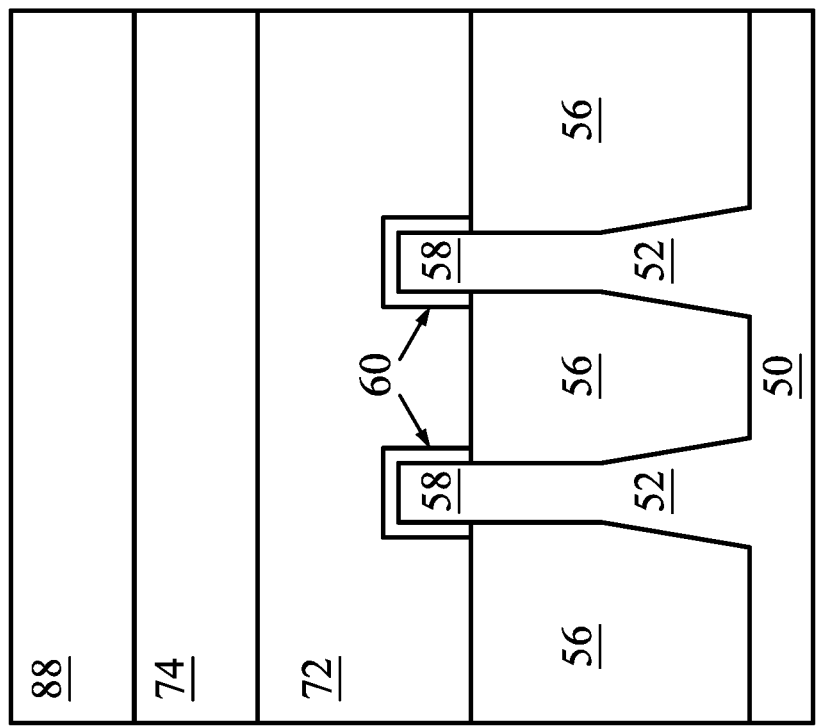

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium (Si$_x$Ge$_{1-x}$, where x can be between approximately 0 and 1), pure Germanium, or the like. Other insulation or semiconductor materials formed by any acceptable process may be used. In some embodiments, a contact etch stop layer (CESL) 87 is disposed between the first ILD 88 and the epitaxial source/drain regions 82, the hard mask 74, and the gate spacers 86. The CESL 87 may comprise a dielectric material, such as, silicon nitride, silicon oxide, silicon ox nitride, or the like, having a different etch rate than the material of the overlying first ILD 88.

Figure 12B:
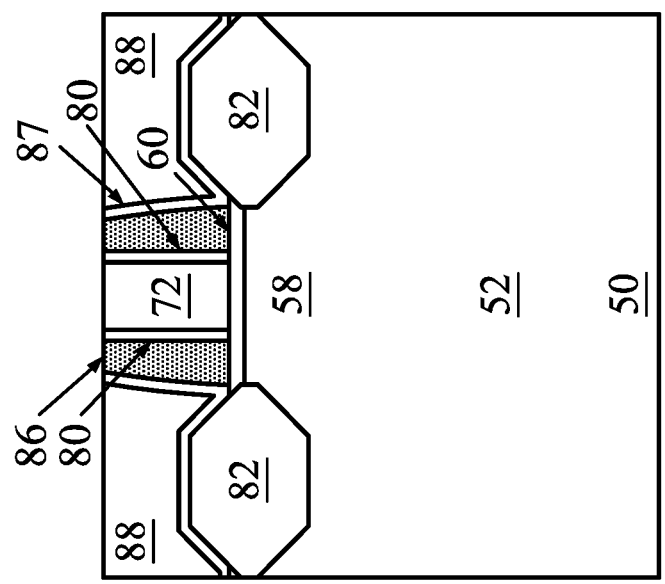
Figure 12A:
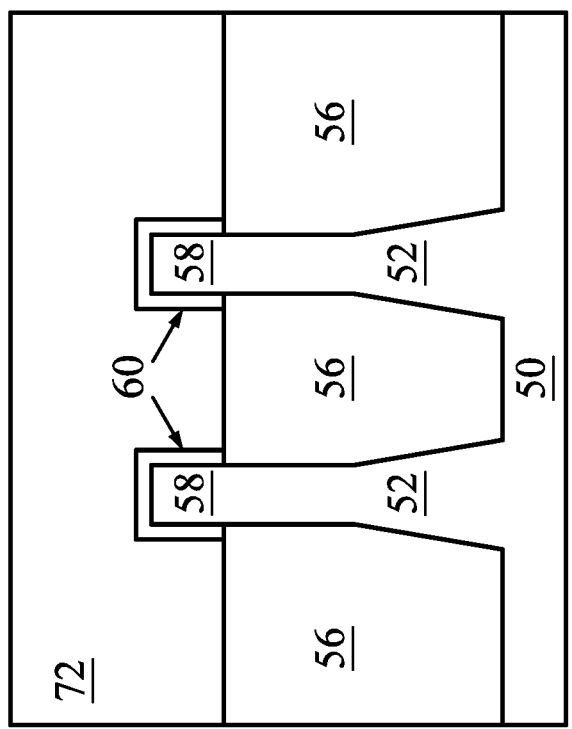

In FIGS. 12A and 12B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

FIGS. 13A through 21D illustrate a replacement gate process where the dummy gates 72 are removed and replaced with a metal gate. As part of the replacement gate process, one or more gate dielectric layers is formed between the metal gate and the fins 52. In various embodiments, a passivation treatment is performed to introduce a passivating species (e.g., fluorine, nitrogen, combinations thereof, or the like) into the one or more gate dielectric layers and reduce defects found therein. The passivation treatment may be a remote plasma treatment, which advantageously provides a desired concentration of the passivating species with a high degree of conformity In the gate dielectric layers. A further advantage of the remote plasma treatment is that it may be performed at a relatively low process temperature, which reduces the risk of damage to the device.

Figure 13B:
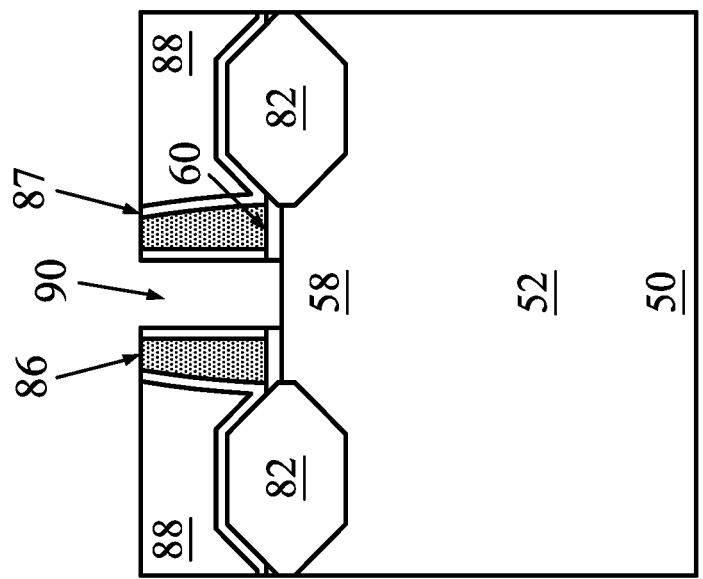
Figure 13A:
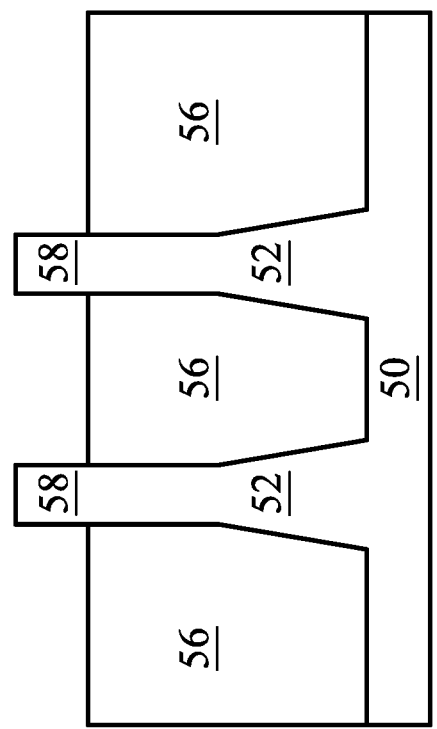

In FIGS. 13A and 13B, the dummy gates 72 are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86.

Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
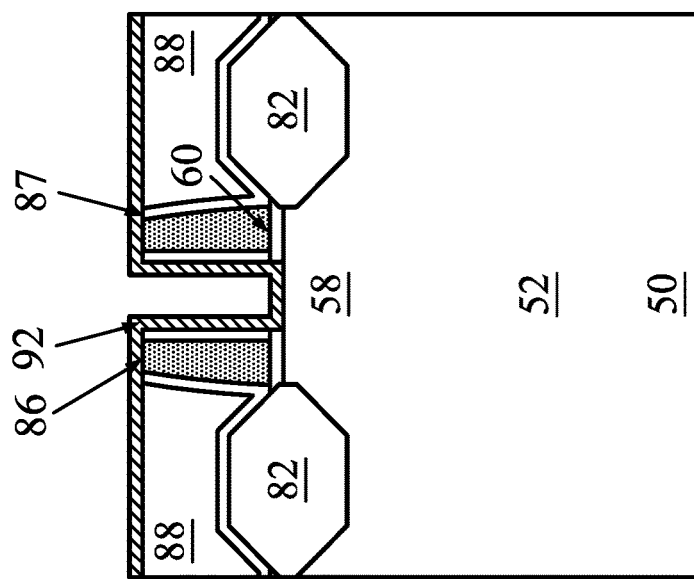
Figure 14A:
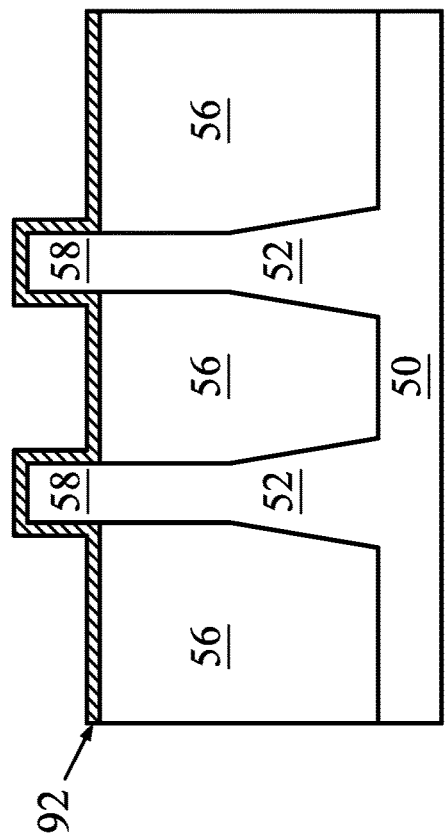

In FIGS. 14A and 14B, one or more gate dielectric layers 92 are deposited over and along sidewalls of the channel regions 58. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on a top surface of the STIs 56 and the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. In some embodiments, the gate dielectric layers 92 may include a layer of a high-k dielectric material and an underlying silicon oxide layer, both of which are form after the removal of the dummy gates 72. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., SiO). As a result of manufacturing limitations of the deposition process, the gate dielectric layers 92 may include defects, such as, dangling bonds, oxygen vacancies, combinations thereof, or the like.

Figure 15B:
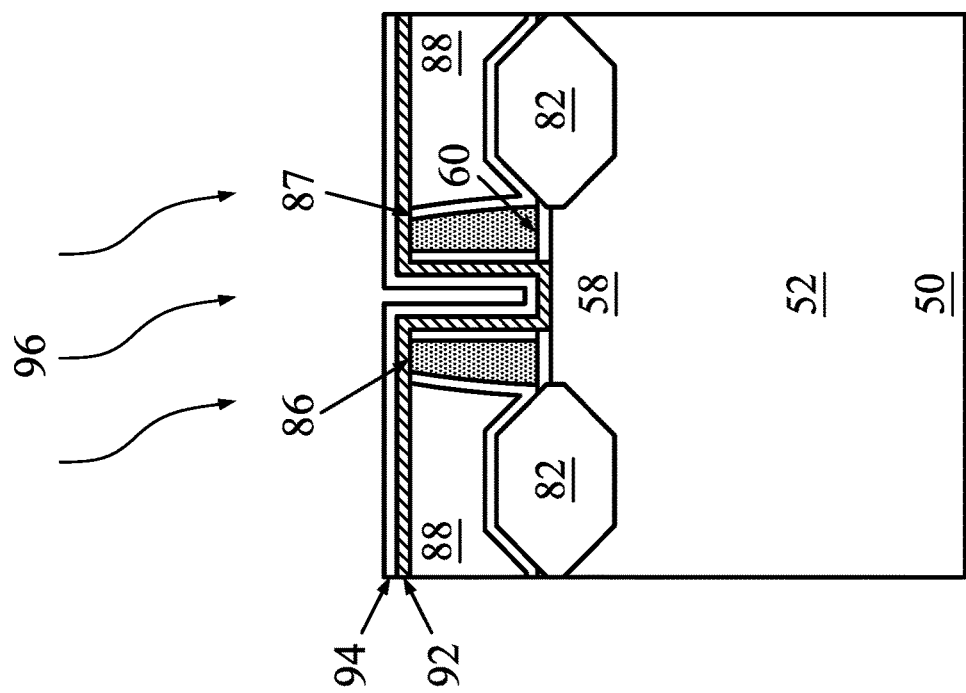
Figure 15A:
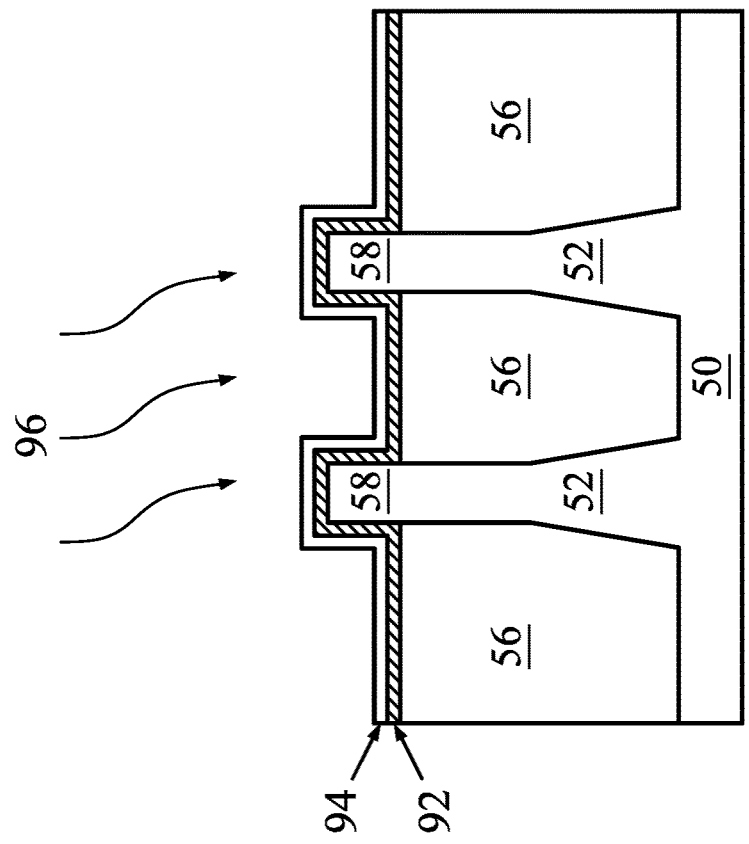

Next, in FIGS. 15A and 15B, an optional adhesion layer 94 is deposited over the gate dielectric layers 92. The adhesion layer 94 may be metal-containing material such as titanium silicon nitride (TSN), titanium nitride, combinations thereof, multi-layers thereof, or the like. The formation of the adhesion layer 94 may include one or more steps of MBD, ALD, PECVD, PVD, combinations thereof or the like. After the adhesion layer 94 is deposited, an optional post metal anneal 96 may be performed to improve the adhesive properties of the adhesion layer 94 and/or gate dielectric layers 92. In some embodiments, the post metal anneal 96 may be in the range of about 100° C. to about 1200° C.

Figure 16B:
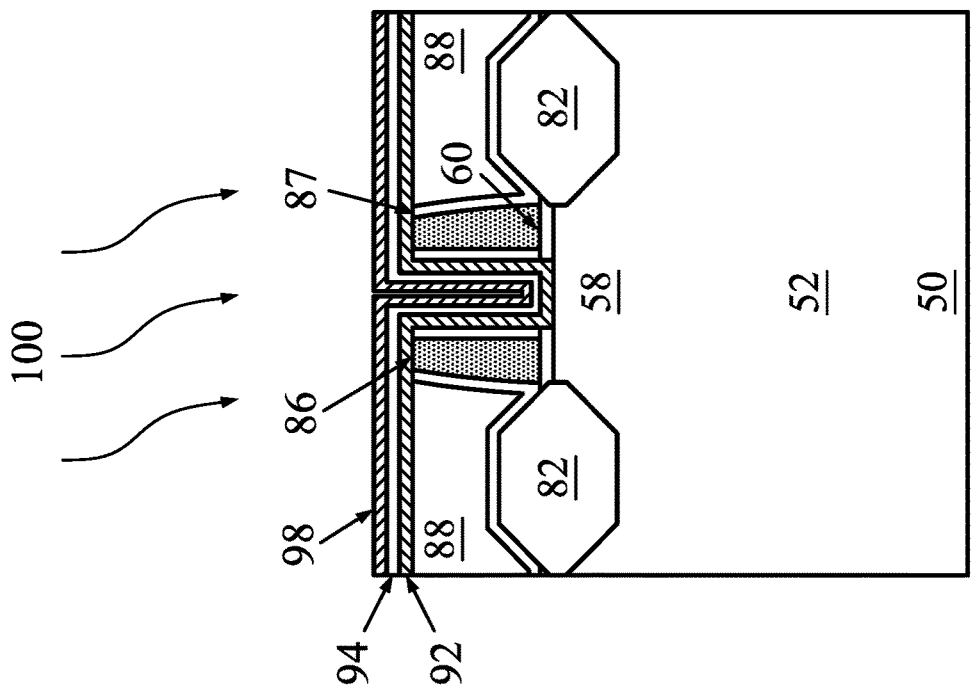
Figure 16A:
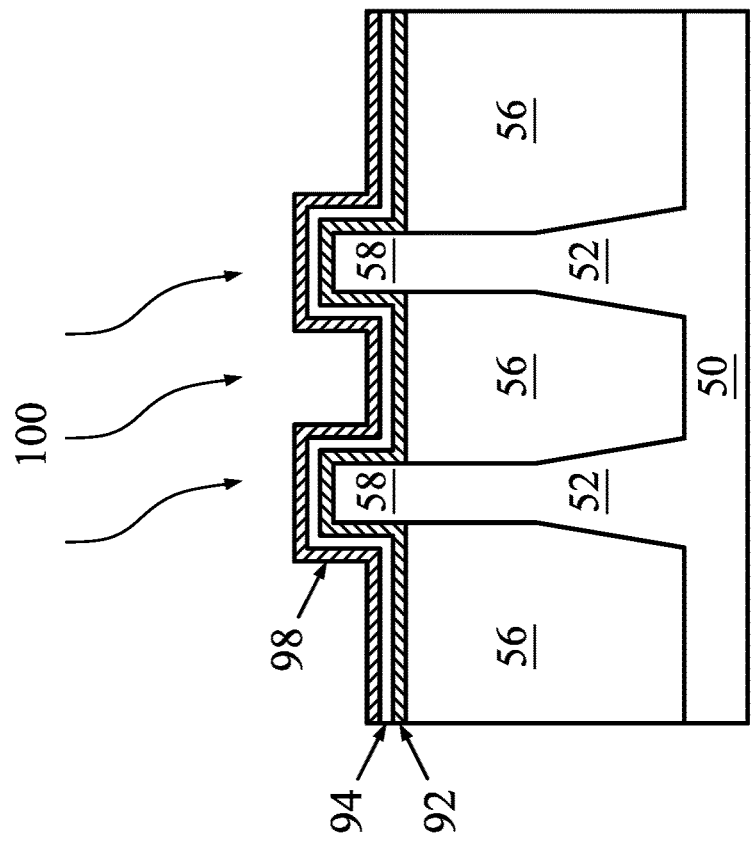

In FIGS. 16A and 16B, an optional capping layer 98 may be deposited on the adhesion layer 94. The capping layer 98 may be a semiconductor material such as silicon, or the like. The formation of the capping layer 98 may include CVD, ALD, PVD, or the like. After the capping layer 98 is deposited, an optional post capping anneal 100 may be performed to further improve the adhesive properties of the adhesion layer 94 and/or gate dielectric layers 92. In some embodiments, the post capping anneal 100 may be in the range of about 100° C. to about 1200° C. After the post capping anneal 100, the capping layer 98 may be removed using a suitable etch process, such as a dry or wet etch process. Removing the capping layer 98 may further remove a portion of the underlying adhesion layer 94. The steps described in FIGS. 15A, 15B, 16A, and 16B are optional, and either one or both of the steps may be omitted in various embodiments.

Figure 17B:
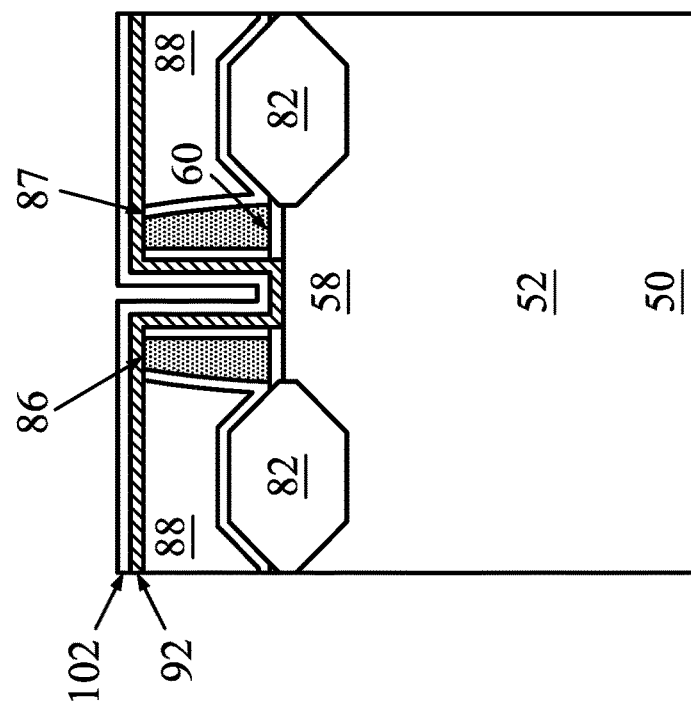
Figure 17A:
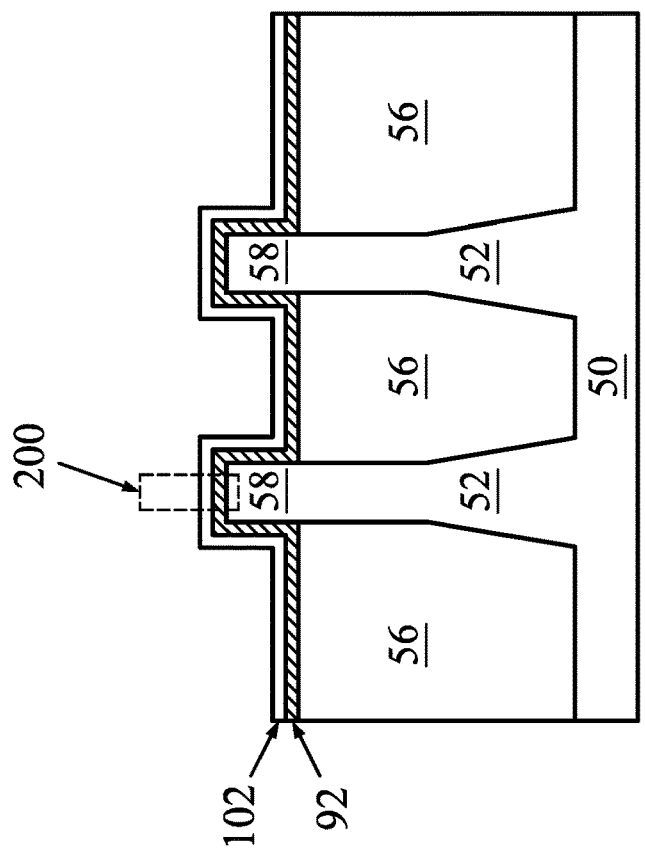

In FIGS. 17A and 17B, work function metal (WFM) layers 102 are deposited over the gate dielectric layers 92. The WFM layers 102 may be a metal-containing material such as Ti, TiN, TiO, Ta, TaN, TaC, Co, Ru, Al, W, combinations thereof, multi-layers thereof, or the like. In embodiments where the adhesion layer 94 is formed, the WFM layers 102 includes the adhesion layer 94.

Figure 17C:
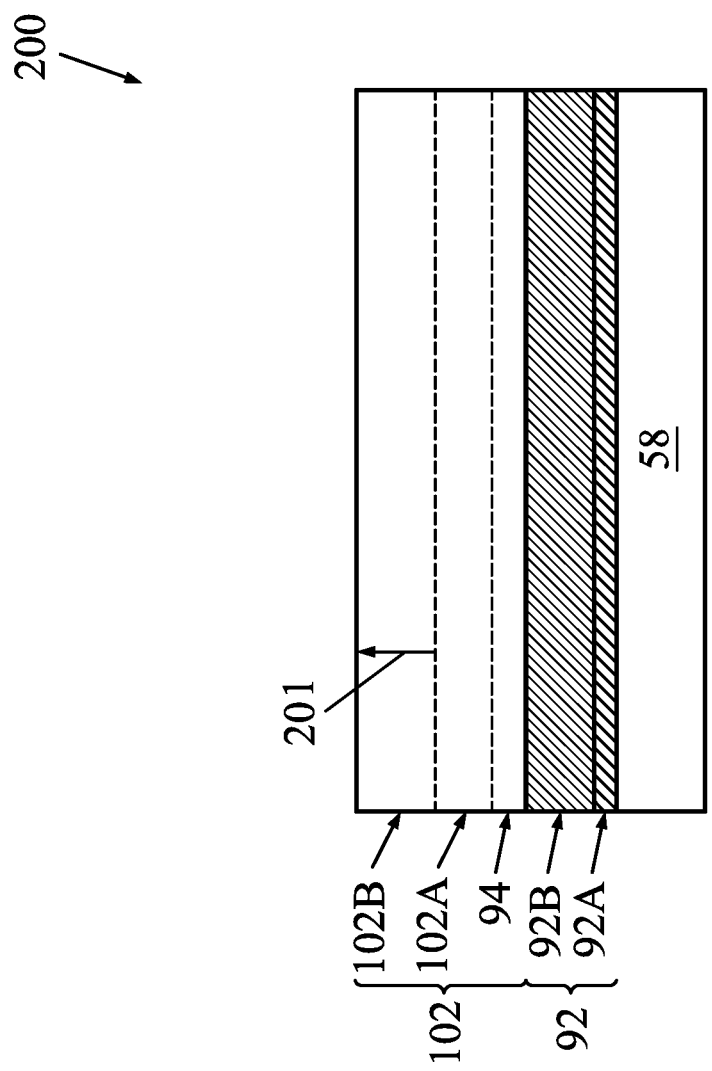

For example, FIG. 17C illustrates a detailed view of area 200 in FIG. 17A according to an embodiment. As illustrated in FIG. 17C, the gate dielectric layers 92 includes a first layer 92A (e.g., a silicon oxide, interfacial layer) and a second layer 92B (e.g., a high-k gate oxide). The first layer 92A may include a remaining portion of the dummy gate dielectric 60 (see FIGS. 12A and 12B), a silicon oxide layer formed after the dummy gates 72 are removed, a combination thereof, or the like.

The WFM layers 102 may include the optional adhesion layer 94, an n-type WFM layer 102A, and an optional capping layer 102B. The n-type WFM layer 102A may comprise a combination of an n-type metal (e.g., Al, Ti, Ta, or the like) and another metal (e.g., Ti, TiN, Ta, TaN, TaC, TiC, TiCSi, or the like). The formation of the n-type WFM layer 102A may include one or more deposition steps of the using CVD, ALD, PVD, or the like. In some embodiments, the deposition process(es) may be performed at temperature to facilitate the diffusion of the n-type metal throughout the n-type WFM layer 102A. In some embodiments, one or more annealing steps may be performed to facilitate the diffusion of the n-type metal throughout the n-type WFM layer 102A. As explained in greater detail below, a concentration of the n-type metal (e.g., Al) in the n-type WFM layer 102A may be selected to achieve a desired concentration of passivating species in the underlying gate dielectric layers 92 in subsequent process steps.

The capping layer 102B may be a metal-containing material such as Ti, TiN, TiO, Ta, TaN, TaC, TiC, TiCSi or the like. The capping layer 102B may comprise a common element with the n-type WFM layer 102A. For example, in some embodiments, the capping layer 102B comprises Ti, and the n-type WFM layer 102A comprises TiAl or TiAlN. A concentration of the n-type metal may gradually decrease in the capping layer 102B in the direction of arrow 201. In some embodiments, a top surface of the capping layer 102B may be substantially free of the n-type metal. The capping layer 102B is optional and may be omitted in some embodiments.

The embodiment WFM layers 102 illustrated by FIG. 17C is just an example, and layers may be omitted or added in other embodiments. For example, although a single n-type WFM layer 102A is illustrated, a multiple n-type WFM layers 102A (e.g., having varied concentrations of the n-type metal) may be used depending on a desired electrical property of the resulting transistor. The configuration of FIG. 17C may be used in region 50N for forming n-type devices, such as NMOS transistors, e.g., n-type FinFETs.

Figure 17D:
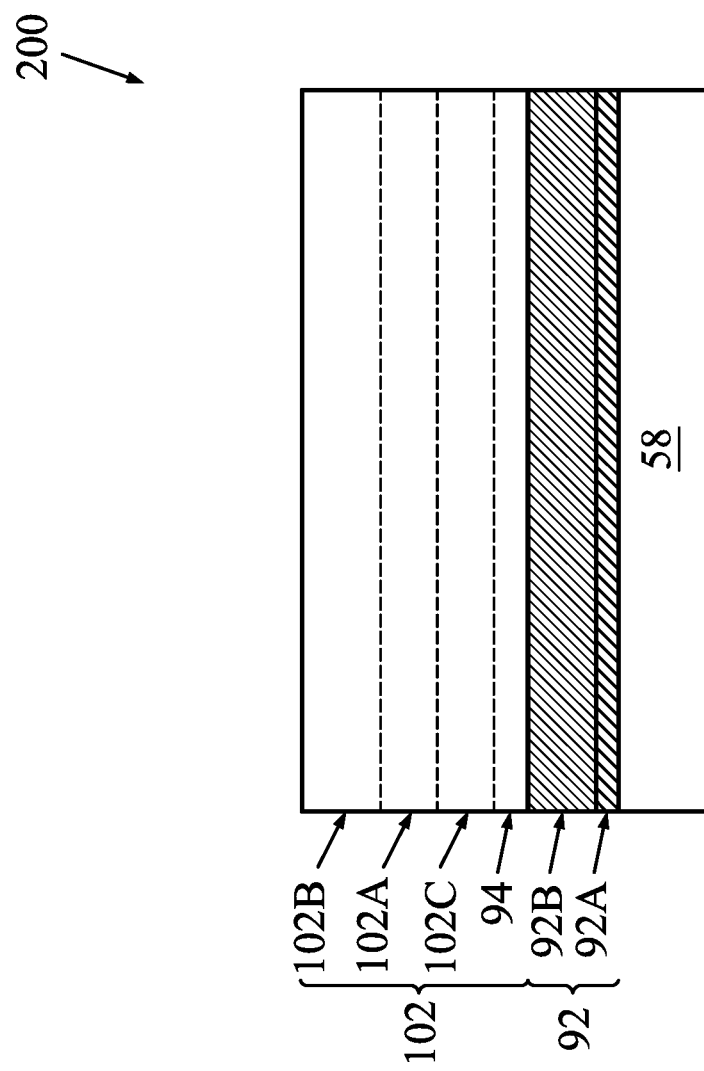

FIG. 17D illustrates a detailed view of area 200 in FIG. 17A according to an alternative embodiment. The configuration of FIG. 17D may be similar to the configuration of FIG. 17C where like reference numerals indicate like elements formed using like processes.

The configuration of FIG. 17D further includes a p-type WFM layer 102C between the n-type WFM layer 102A and the gate dielectric layers 92. The p-type WFM layer 102C may comprise a metal (e.g., Ti, TiN, Ta, TaN, TaC, WC, WCN, MoN, or the like), and the p-type WFM layer 102C may be substantially free of the n-type metal in the n-type WFM layer 102A. The formation of the p-type WFM layer 102C may include one or more deposition steps of the using CVD, ALD, PVD, or the like. Although a single p-type WFM layer 102C is illustrated, multiple p-type WFM layers may be used depending on a desired electrical characteristic of the resulting transistor. The configuration of FIG. 17D may be used in region 50P for forming p-type devices, such as PMOS transistors, e.g., p-type FinFETs.

Figure 18B:
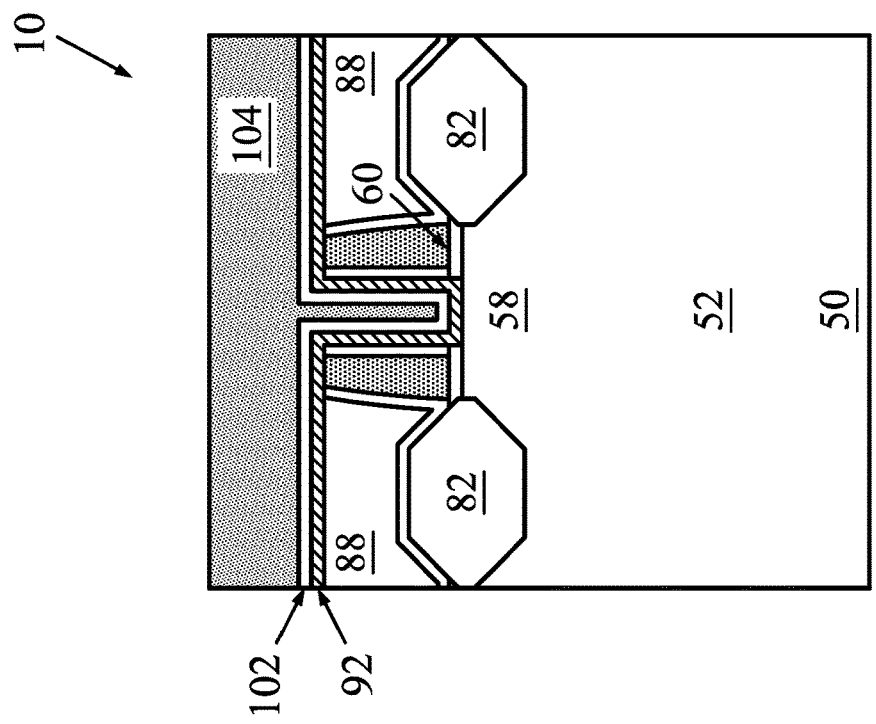
Figure 18A:
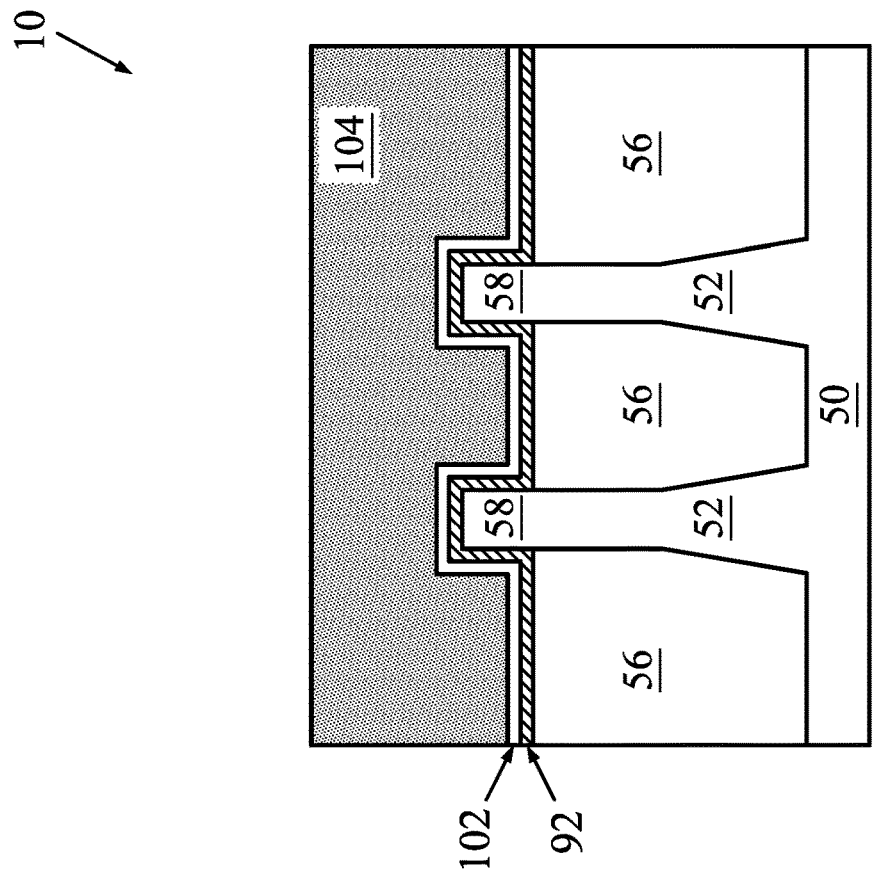

In FIGS. 18A and 18B, a passivation treatment is applied to WFM layers 102. The passivation treatment may include introducing passivating species 104 to exposed surfaces of the WFM layers 102. In some embodiments, the passivating species 104 include radicals, such as, fluorine radicals, nitrogen radicals, combinations thereof, or the like. The passivating species 104 may be highly reactive with the n-type metal (e.g., Al) in the WFM layers 102 (e.g., in the n-type WFM layer 102A, see FIGS. 17C and 17D). As a result, the n-type metal in the WFM layers 102 may attract the passivating species 104 and draw them into the underlying gate dielectric layers 92. The passivating species 104 passivate defects (e.g., fill oxygen vacancies, terminate dangling bonds, etc.) within the gate dielectric layers 92. As a result, a film quality of the gate dielectric layers 92 may be improved and device reliability and performance may be improved. In some embodiments, the passivating species 104 may only diffuse into a subset of the gate dielectric layers 92. For example, the passivating species 104 may passivate the second layer 92B (e.g., the high-k gate oxide, see FIGS. 17C and 17D) without passivating the first layer 92A (e.g., a silicon oxide, interfacial layer, see FIGS. 17C and 17D) of the gate dielectric layers 92. In other embodiments, the passivating species 104 may be present throughout the gate dielectric layers 92.

Figure 18C:
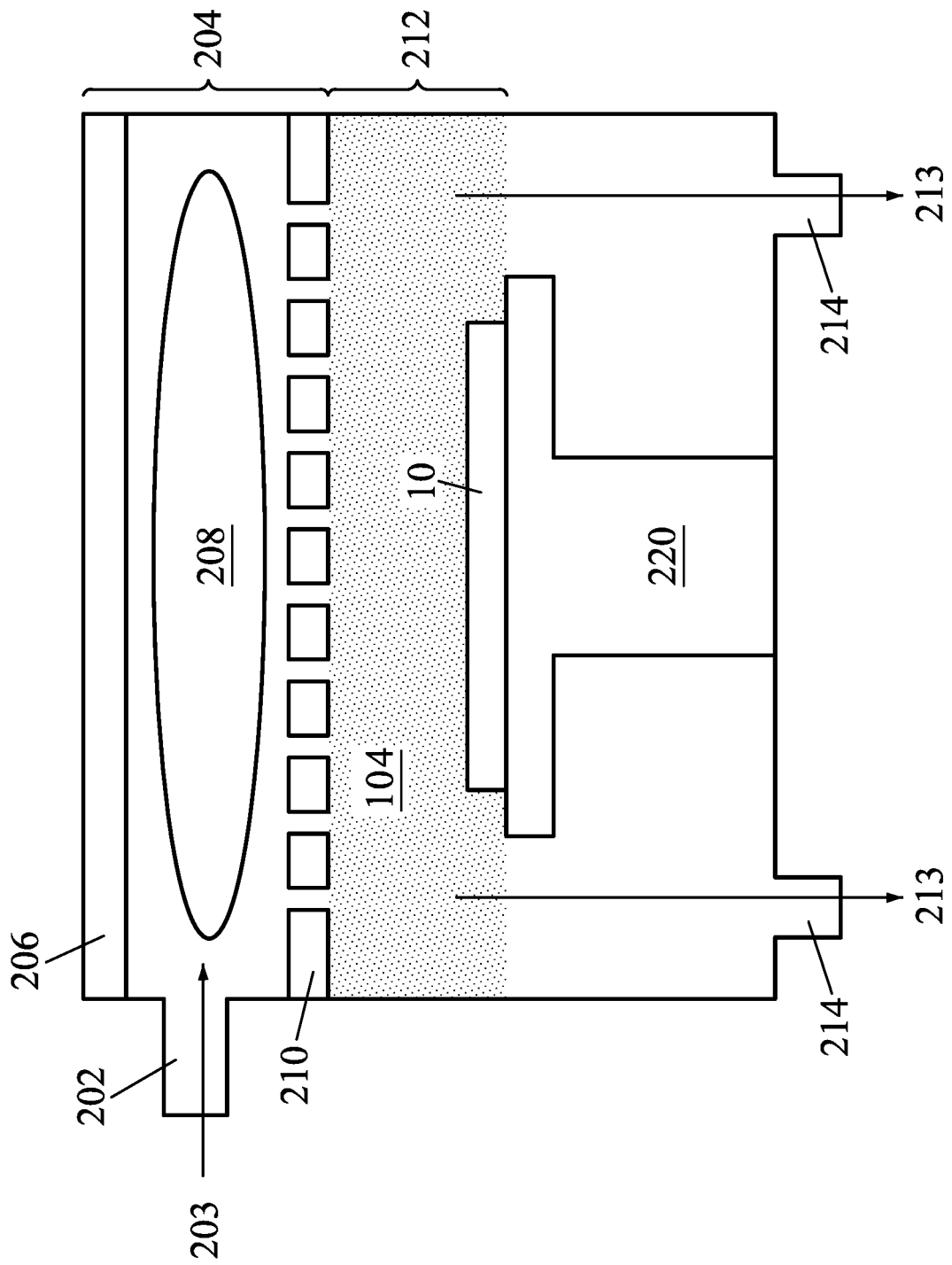
FIG. 18C illustrate a process chamber for performing processes on a wafer in accordance with some embodiments.

FIG. 18C illustrates a processing tool during the passivation treatment of the wafer 10 according to various embodiments. The wafer 10 is placed on a supporting chuck 220 in a region 212 of the processing tool.

The processing tool includes an inlet 202, which allows a process gas to be flowed into the tool as indicated by arrow 203. The process gas may include a precursor. In embodiments where the passivating species 104 comprises fluorine or nitrogen, the precursor may be any fluorine and/or nitrogen containing precursor, such as, $NF_3$, $NH_3$, combinations thereof, or the like. The process gas may further include a carrier gas, such as, $H_2$, $N_2$, He, combinations thereof, or the like. In the process gas, the precursor may be diluted by the carrier gas, and a concentration of the precursor gas may be in the range of about 1.0 atomic percent (at %) to about 40.0 at %. A concentration, flow rate, and amount of time the process gas is flowed may be selected according to a desired concentration of the passivating species 104 in the gate dielectric layers 92 (see FIGS. 18A and 18B).

The process gas flows into a region 204, and plasma ions are generated from the process gas. Any method of generating plasma ions from the process gas may be used. For example, in FIG. 18C, plasma ions 208 are generated between two electrodes 206 and 210. The top electrode 206 may be an inductively coupled plasma (ICP) coil. Other plasma generation methods may be used in other embodiments. The plasma ions 208 may be generated at a power in a range of about 5 W to about 5000 W and at a pressure of in a range of about 10 mTorr to 5000 mTorr depending on the plasma generation technique. Further, the passivation treatment may be performed at a relatively low temperature, e.g., less than about 100° C., such as in the range of about 15° C. to about 87° C. The relatively low thermal budget of the passivation treatment advantageously reduces the risk of damage to the wafer 10.

The bottom electrode 210 may provide a filter, which spatially separates the region 204 (e.g., where the plasma ions are generated) from region 212 (e.g., where the wafer 10 is located). Thus, the passivation treatment may be a remote plasma treatment in some embodiments. The bottom electrode 210 may include a plurality of openings through which a plasma afterglow (providing radicals) is generated from the plasma ions 208. Other plasma ion filter methods (e.g., ion filter plasma tools) may be used in other embodiments. The wafer 10 is exposed to the passivating species 104 (e.g., radicals of the plasma afterglow). Excess gases may be pumped out of the process chamber through one or more exhausts 214 as illustrated by arrows 213.

In various embodiments, using radicals instead of plasma ions to perform the passivation treatment provides advantages. For example, the radicals are relatively low energy compared to plasma ions, and thus, the risk of damage to the wafer 10 can be reduced. Further, the use of a plasma afterglow is isotropic compared to a plasma ion implantation, which is anisotropic (e.g., directional and dependent on implantation angle). As such, increased conformality of the radicals in the gate dielectric layers 92 can be achieved using an isotropic process. Further, the remote plasma process is not dependent on the conformity of a gap filling, deposition process to diffuse the passivating species into the gate dielectric layers 92. Thus, the remote plasma process may be useful for passivating gate dielectric layers formed on high-aspect ratio fins and/or closely spaced fins. Additionally, a concentration of the passivating species can be controlled by adjusting a concentration of the n-type metal (e.g., Al) in the WFM layers 102 and/or processing parameters (e.g., precursor concentration, precursor flow rate, time, plasma power, plasma process, combinations thereof, or the like) of the passivation treatment. Embodiment remote plasma, passivation treatments allows for a concentration of the passivating species be easily tuned to a desired range (e.g., a range that effectively passivates the gate dielectric layers 92 without significantly damaging the WFM layers 102).

Figure 19B:
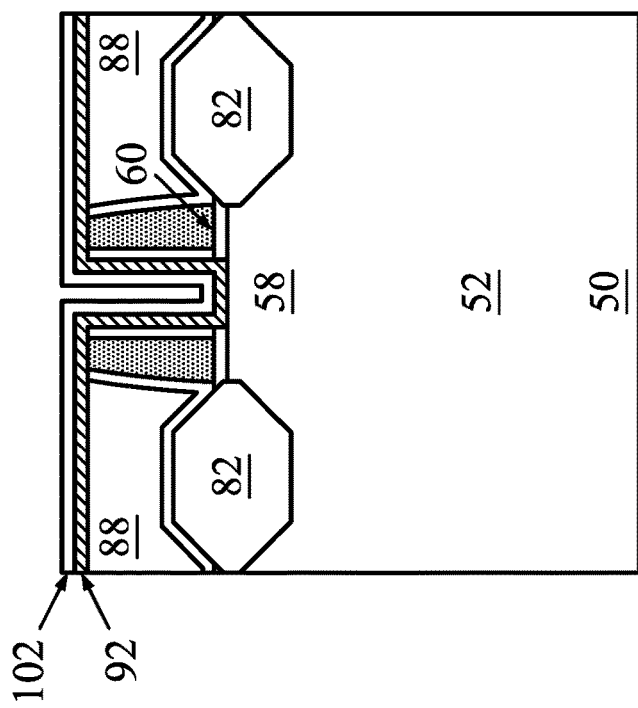
Figure 19A:
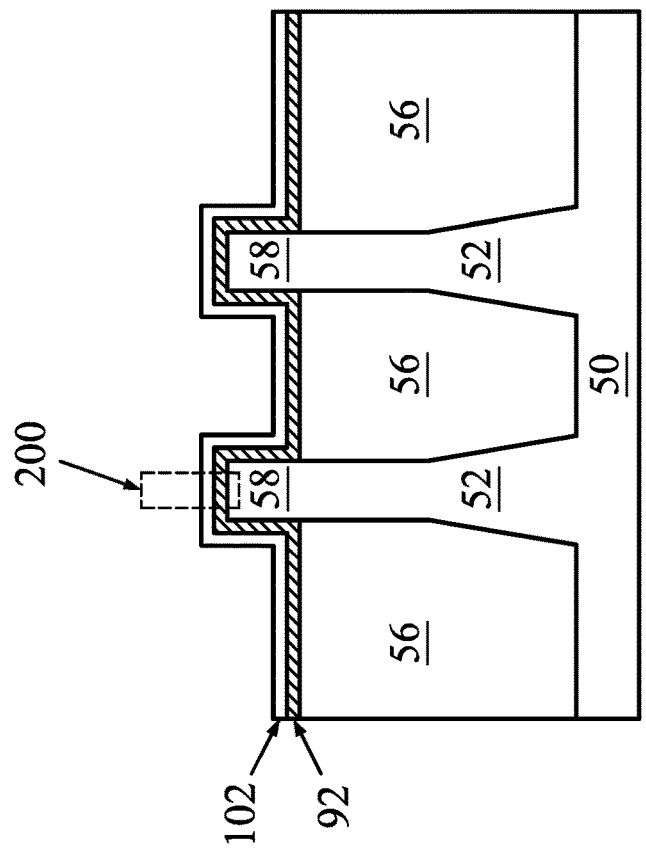
Figure 19C:
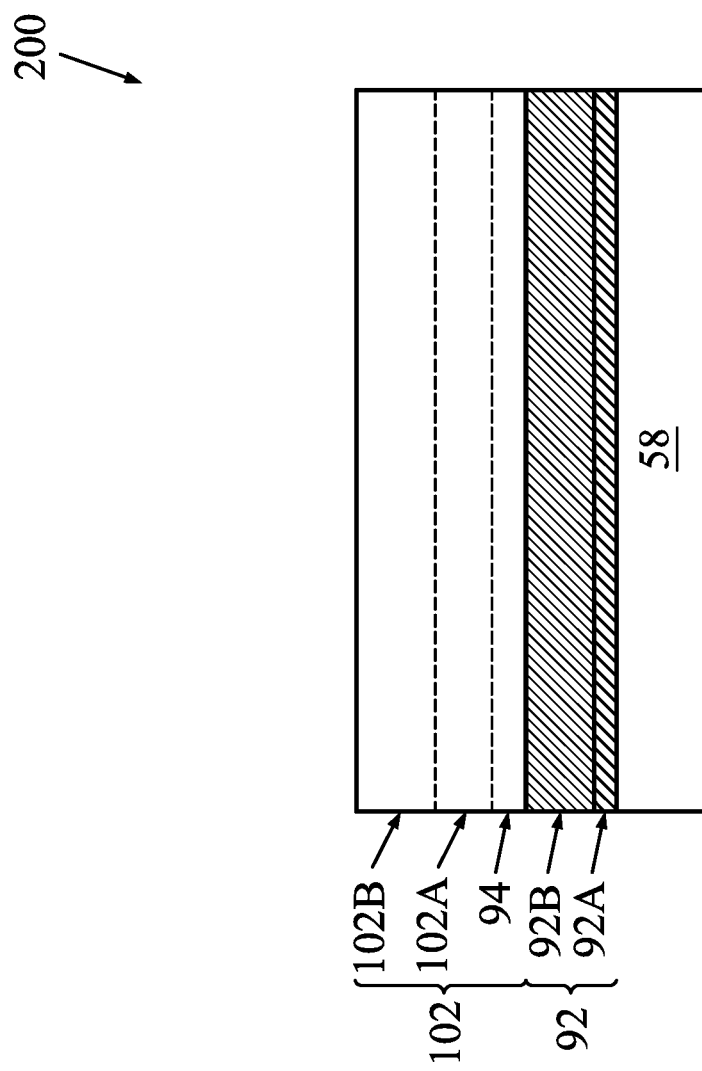
Figure 19D:
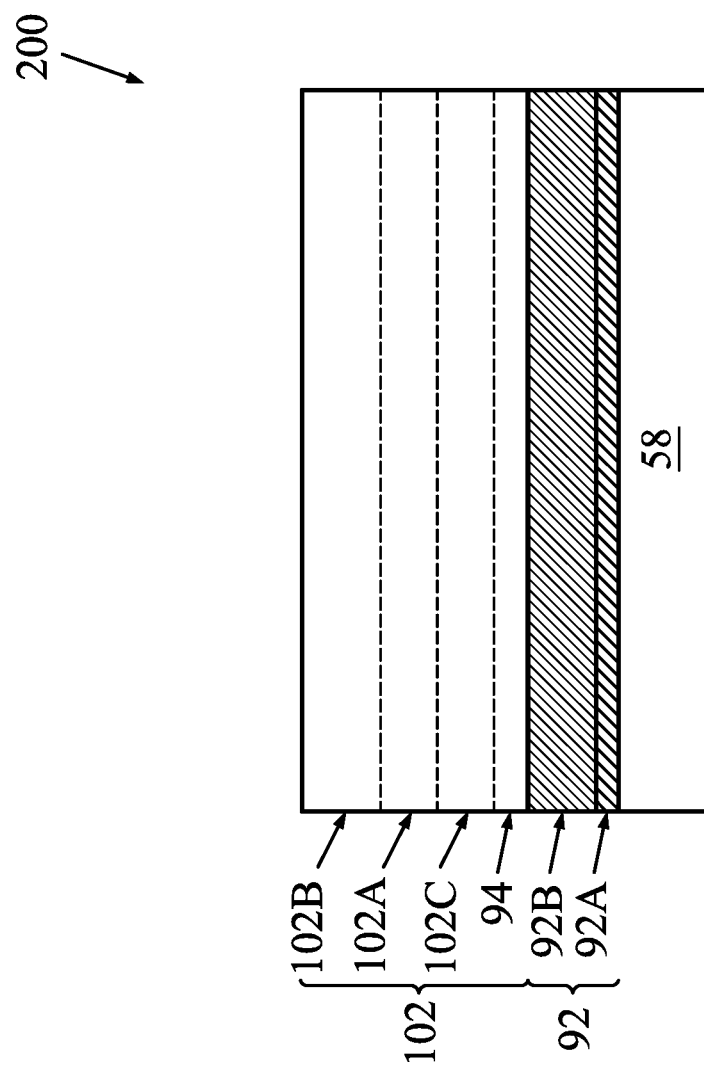

FIGS. 19A and 19B illustrate the WFM layers 102 and the gate dielectric layers 92 after the passivation treatment. FIGS. 19C and 19D illustrate detailed views of area 200 in FIG. 19A. FIG. 19C illustrates an embodiment corresponding to FIG. 17C, and FIG. 19D illustrates an embodiment corresponding to FIG. 17D. As a result of the passivation treatment, the passivating species (e.g., F, N, or the like) can be found in the WFM layers 102 and the gate dielectric layers 92. As illustrated by FIGS. 19C and 19D, the passivating species may only be present in the second layer 92B (e.g., the high-k gate oxide) without being present in the underlying first layer 92A (e.g., the interfacial layer). In other embodiments, the passivating species may be found throughout the gate dielectric layers 92.

Alternatively, when the WFM layers 102 comprised a common element as the passivating species prior to the passivation treatment, a greater than stoichiometric concentration of the passivating species may be found in the WFM layers 102. For example, in embodiments where the WFM layers 102 comprised nitrogen prior to the passivation treatment, and the passivating species is nitrogen, the WFM layers 102 may comprise a higher than stoichiometric concentration of nitrogen as a result of the passivation treatment.

In some embodiments a concentration of the passivating species in the WFM layers 102 on a top surface of the channel region 58 is in the range of 1.0 at % to 40.0 at %, and a concentration of the passivating species in the WFM layers 102 on sidewalls of the channel region 58 is in the range of 1.0 at % to 40.0 at %. In some embodiments a concentration of the passivating species in the gate dielectric layers 92 (e.g., in the high-k gate oxide layer 92B) on a top surface of the channel region 58 is in the range of 1.0 at % to 40.0 at %, and a concentration of the passivating species in the gate dielectric layers 92 (e.g., in the high-k gate oxide layer 92B) on sidewalls of the channel region 58 is in the range of 1.0 at % to 40.0 at %. It has been observed that by having passivating species in these concentrations, the defects of the gate dielectric layers 92 may be advantageously ameliorated, which improves device reliability and performance. For example, it has been observed that concentrations less than the above ranges result in an insufficient passivation in the high-k dielectric layers 92, leading to limited benefits in device performance and reliability. It has further been observed that concentrations greater than the above ranges results in reduced film quality of the WFM layers 102, which results in a degradation of device performance and reliability.

Figure 19E:
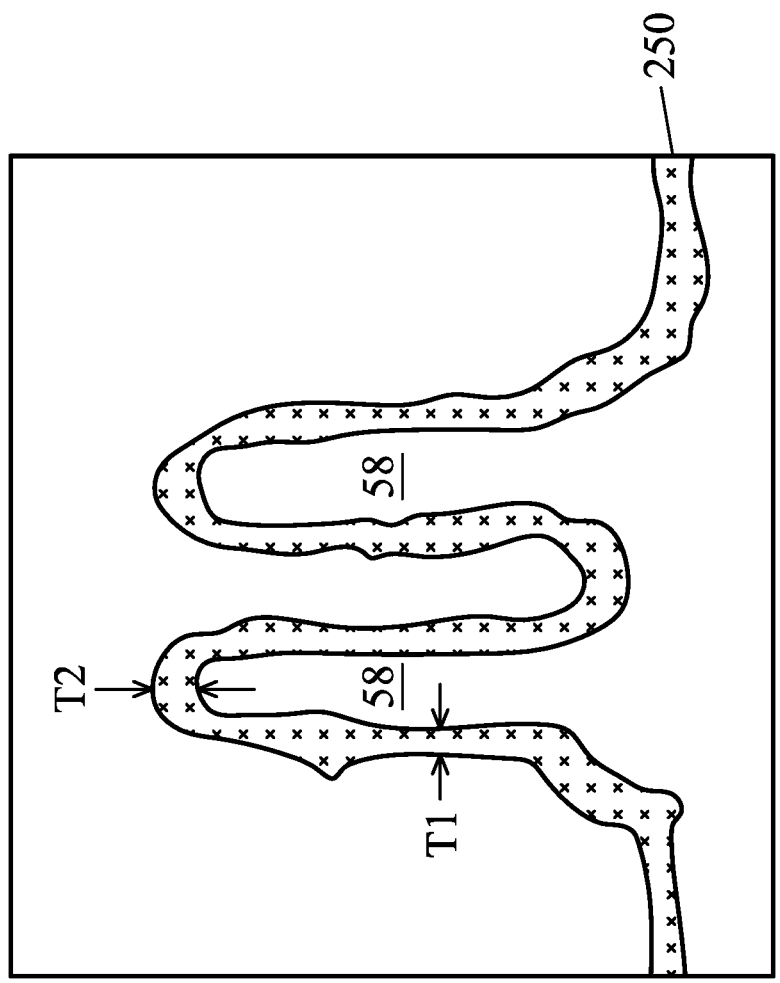

FIG. 19E illustrates a profile of a passivated region 250 on the channel region 58. The passivated region 250 is an area comprising the passivating species on the channel regions 58. For example, the passivated region 250 may include portions of the WFM layers 102 and the gate dielectric layers 92 comprising the passivating species. In some embodiments, the passivated region 250 may be formed by all of the WFM layers 102 and may be further formed by all of the gate dielectric layers 92. A profile of the passivated region 250 may be determined by performing, for example, an elemental mapping of the passivating species (e.g., fluorine) using energy-dispersive X-ray spectroscopy analysis of a transmission electron microscopy (TEM) image or scanning electron microscope (SEM) image of the relevant area.

In some embodiments, a thickness T1 of the passivated region 250 on sidewalls of the channel region 58 may be in the range of about 2.0 nm to about 10.0 nm, and a thickness T2 of the passivated region 250 on a top surface of the channel region 58 may be in the range of about 2.0 nm to about 10.0 nm. Further a ratio of an average thickness of the passivated region 250 on the sidewalls of the channel region 58 to an average thickness of the passivated region 250 on the top surface of the channel region 58 may be in the range of about 0.8:1.0 to about 0.9:1.0. It has been observed that when the passivated region 250 has thicknesses within the above ranges and/or satisfying the above ratios, sufficient conformity of the passivating treatment is achieved to provide good defect treatment coverage and improved device performance.

Figure 20B:
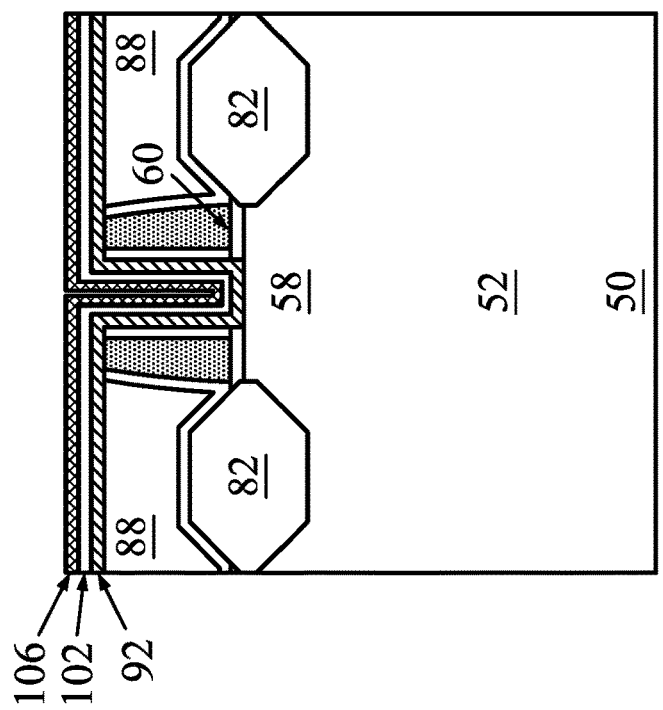
Figure 20A:
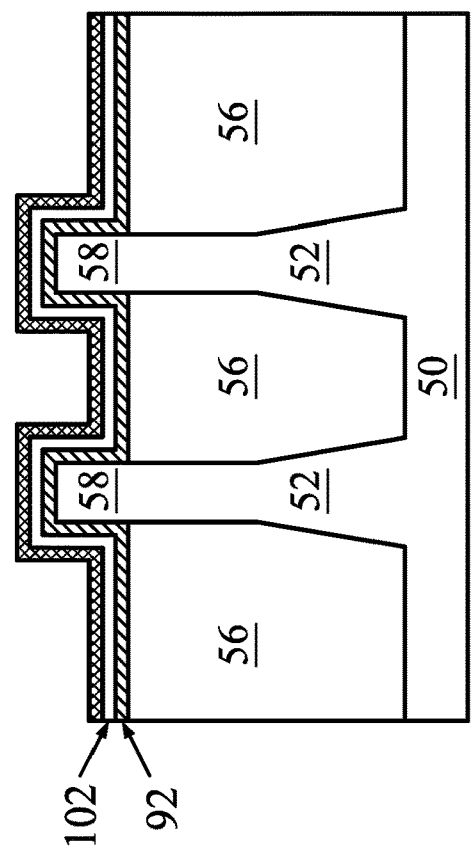

In FIGS. 20A and 20B, a liner 106 is deposited over the WFM layers 102. The liner 106 may be a metal-containing material such as TiN, TiO, TaN, TaC, combinations thereof, multi-layers thereof, or the like. The formation of the liner 106 may include one or more deposition steps of the using CVD, ALD, PVD, or the like. In some embodiments, the liner 106 may provide as a barrier layer, an adhesion layer, a wetting layer, or the like. A thickness of the liner 106 may be in the range of about 10 Å to about 100 Å, such as about 40 Å. It has been observed that when the liner 106 has this range of thicknesses, improved device performance can be achieved. For example, a thinner liner 106 may provide insufficient adhesion with an unacceptably high resistance. Because the liner 106 is deposited after the passivation treatment, the liner 106 may be substantially free of the passivating species. Alternatively, the liner 106 may be deposited with a stoichiometric concentration of a common element (e.g., N) as the passivating species. For example, in some embodiments, the liner 106 may be formed of stoichiometric TiN, and the passivating species may also be nitrogen.

Figure 21C:
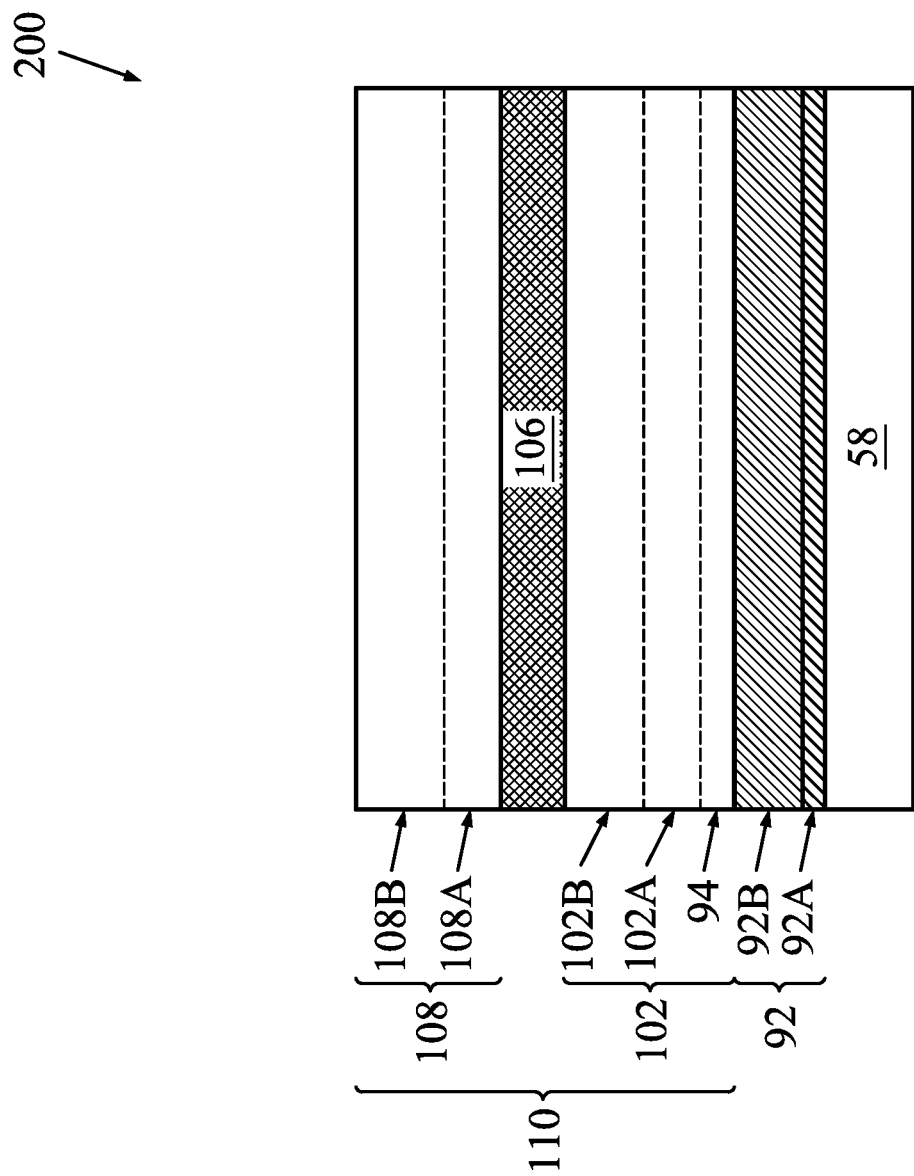
Figure 21D:
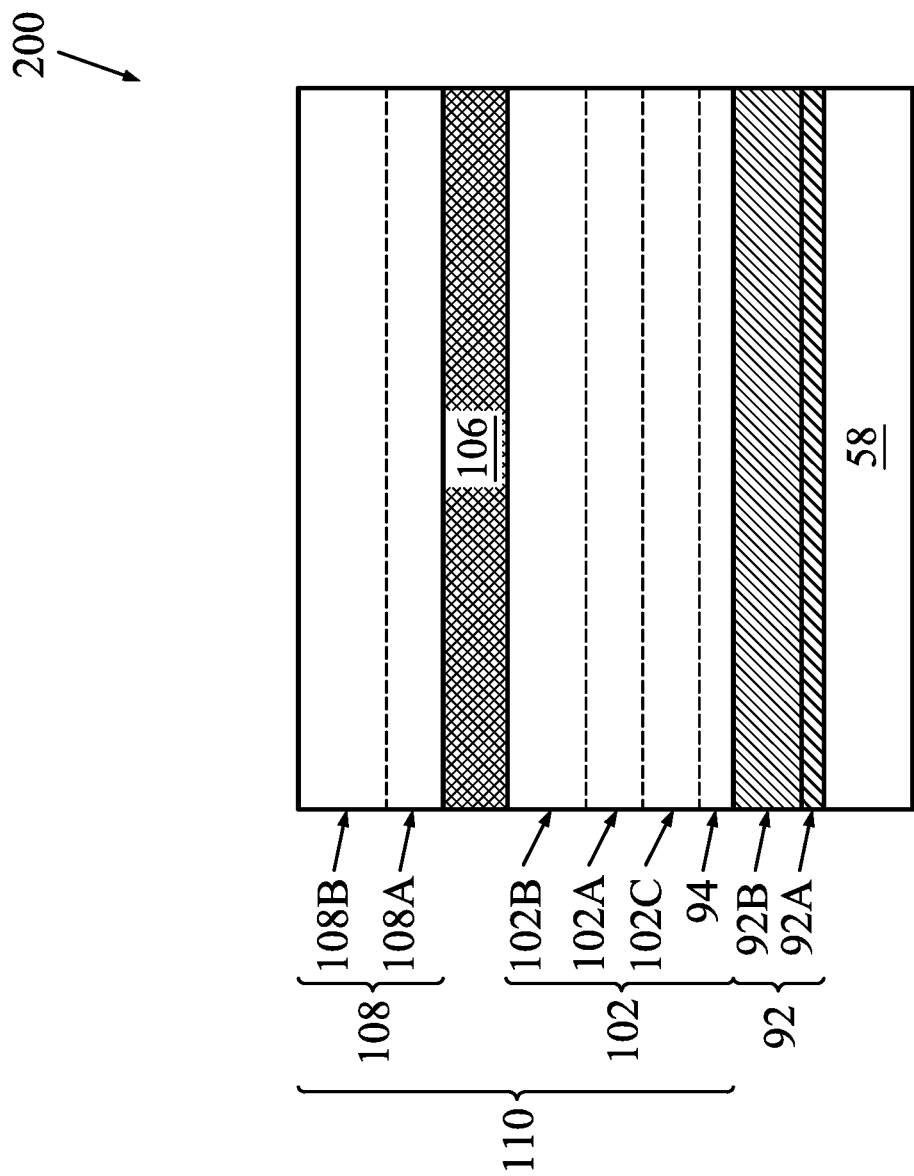

Next, in FIGS. 21A and 21B, a fill metal 108 is formed over the liner 106. FIGS. 21C and 21D illustrate detailed views of area 200 in FIG. 21A. FIG. 21C illustrates an embodiment corresponding to FIG. 17C, and FIG. 21D illustrates an embodiment corresponding to FIG. 17D. The fill metal 108 may be a metal-containing material such as Co, Ru, Al, W, combinations thereof, multi-layers thereof, or the like. The formation of the fill metal 108 may include one or more deposition steps of the using CVD, ALD, PVD, or the like. As illustrated by FIGS. 21C and 21D, the fill metal 108 may be a multi-layered structure comprising, for example, a first layer 108A and a second layer 108B. For example, in embodiments where the fill metal 108 comprises W, the first layer 108A may be a fluorine free tungsten (FFW) layer, and the second layer 108B may be a low fluorine tungsten (LFW) layer. The number of layers of the fill metal 108 may be greater or fewer in other embodiments. Because the fill metal 108 is deposited after the passivation treatment, the fill metal 108 may be substantially free of the passivating radicals. As a result, gate electrodes 110 comprising the WFM layers 102, the liner 106, and the fill metal 108 are formed. Alternatively, the fill metal 108 may be deposited with a common element as the passivating species. For example, the fill metal 108 may comprise LFW, and the passivating species may be fluorine.

After the filling of the gate electrodes 110, a planarization process, such as a CMP, may be performed to remove the excess portions of the gate dielectric layers 92 and the material of the gate electrodes 110, which excess portions are over the top surface of the ILD 88. The remaining portions of material of the gate electrodes 110 and the gate dielectric layers 92 thus form replacement gates of the resulting FinFETs. The gate electrodes 110 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 110 may occur simultaneously such that the gate electrodes 110 in each region are formed from the same materials. In some embodiments, the gate dielectric layers 92 in each region may be formed by distinct processes, such that the gate dielectric layers 92 may be different materials, and/or the gate electrodes 110 in each region may be formed by distinct processes, such that the gate electrodes 110 may be different materials. Various masking steps may be used to mask and expose appropriate regions when using distinct processes.

In FIGS. 22A and 22B, a second ILD 112 is deposited over the first ILD 88. In an embodiment, the second ILD 112 is a flowable film formed by a flowable CVD method. In some embodiments, the second ILD 112 is formed of a dielectric material such as PSG, BSG, BPSG, USG, or the like, and may be deposited by any suitable method, such as CVD and PECVD.

Figure 23A:
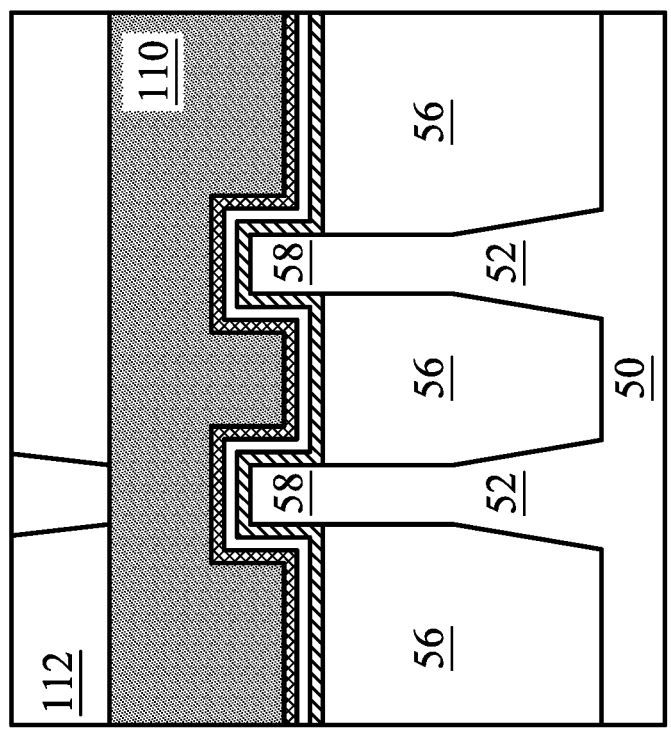
Figure 23B:
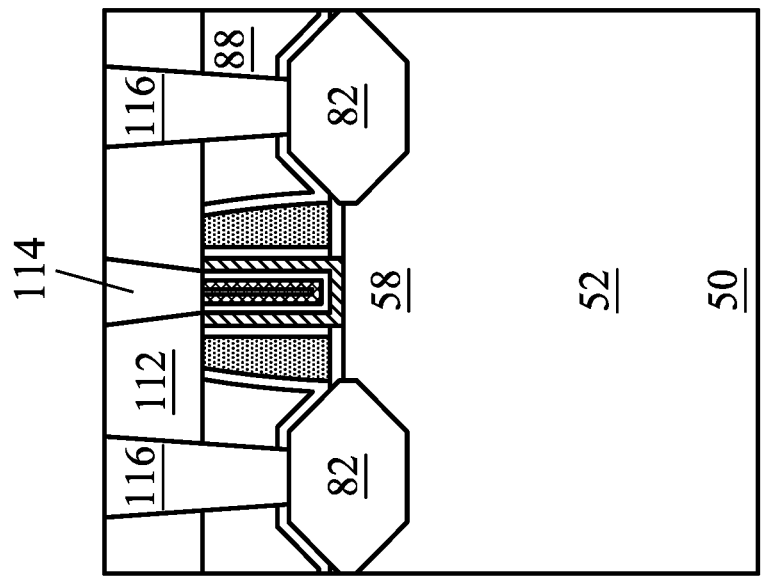

In FIGS. 23A and 23B, gate contacts 114 and source/drain contacts 116 are formed through the second ILD 112 and the first ILD 88 in accordance with some embodiments. Openings for the source/drain contacts 116 are formed through the first and second ILDs 88 and 116, and openings for the gate contact 114 are formed through the second ILD 112. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 112. The remaining liner and conductive material form the source/drain contacts 116 and gate contacts 114 in the openings. An anneal process may be performed to form a silicide at the interface between the epitaxial source/drain regions 82 and the source/drain contacts 116. The source/drain contacts 116 are physically and electrically coupled to the epitaxial source/drain regions 82, and the gate contacts 114 are physically and electrically coupled to the gate electrodes 110. The source/drain contacts 116 and gate contacts 114 may be formed in different processes, or may be formed in the same process. Although shown as being formed in the same cross-sections, it should be appreciated that each of the source/drain contacts 116 and gate contacts 114 may be formed in different cross-sections, which may avoid shorting of the contacts.

Various embodiments provide a passivation treatment for one or more gate dielectric layers of a transistor formed on a wafer. The passivation treatment includes introducing a passivating species (e.g., fluorine, nitrogen, or the like) into the gate dielectric layer(s) using a remote plasma process. The passivating species may be introduced by exposing the wafer to radicals (e.g., fluorine radicals, nitrogen radicals, or the like). The passivating species may help fix defects (e.g., dangling bonds, oxygen vacancies, or the like) in the gate dielectric layer(s), improving device performance. In some embodiments, an n-type work function metal over the gate dielectric layer(s) may facilitate the passivation treatment by attracting the passivating species into the gate dielectric layer(s). By using a remote plasma process, improved conformity and a desired doping concentration of the passivating species can be achieved in the gate dielectric layer(s). Further, the passivation treatment may be performed at a relatively low temperature (e.g., with a low thermal budget), which reduces the risk of damage to the transistor as a result of the passivation treatment.

In an embodiment, a method includes depositing a high-k gate dielectric layer over and along sidewalls of a semiconductor fin; depositing an n-type work function metal layer over the high-k gate dielectric layer; performing a passivation treatment on the high-k gate dielectric layer through the n-type work function metal layer, wherein the passivation treatment comprises a remote plasma process; and depositing a fill metal over the n-type work function metal layer to form a metal gate stack over the high-k gate dielectric layer, the metal gate stack comprising the n-type work function metal layer and the fill metal. Optionally, in an embodiment, the remote plasma process comprises exposing the high-k gate dielectric layer to radicals. Optionally, in an embodiment, the radicals are fluorine radicals, nitrogen radicals, or a combination thereof. Optionally, in an embodiment, the n-type work function metal layer comprises aluminum, and wherein the passivation treatment comprises using the aluminum to attract the radicals into high-k gate dielectric layer. Optionally, in an embodiment, depositing the high-k gate dielectric layer comprises depositing the high-k gate dielectric layer comprising oxygen vacancies, dangling bonds, or a combination thereof. Optionally, in an embodiment, the passivating treatment provides a passivating species in the high-k gate dielectric layer to fill the oxygen vacancies, terminate the dangling bonds, or a combination thereof. Optionally, in an embodiment, the method further includes depositing an adhesion layer between the high-k gate dielectric layer and the n-type work function metal layer; and depositing a capping layer over the n-type work function metal layer. Optionally, in an embodiment, the method further comprises depositing a barrier layer between the n-type work function metal layer and the fill metal. Optionally, in an embodiment, the method further comprises depositing a p-type work function metal layer between the high-k gate dielectric layer and the n-type work function metal layer. Optionally, in an embodiment, depositing the fill metal over the n-type work function metal layer comprises depositing the fill metal over the n-type work function metal layer after the passivation treatment.

In accordance with another embodiment, a method includes forming a semiconductor fin extending above an isolation region in a semiconductor device; depositing a high-k gate dielectric layer over and along sidewalls of the semiconductor fin, the high-k gate dielectric layer comprising deposition defects; depositing a first work function metal layer over the high-k gate dielectric layer, wherein the first work function metal layer comprises an n-type metal; introducing a passivating species into the high-k gate dielectric layer through the first work function metal layer, wherein introducing the passivating species comprises: generating a plasma; filtering the plasma to provide radicals from an afterglow of the plasma, wherein the semiconductor device is exposed to the radicals; and after introducing the passivating species, depositing fill metal over the first work function metal layer. Optionally, in an embodiment, generating the plasma comprises generating the plasma from a precursor gas comprising fluorine, nitrogen, or a combination thereof. Optionally, in an embodiment, the method further comprises forming a second work function metal layer between the high-k gate dielectric layer and the first work function metal layer, wherein the second work function metal layer is a p-type work function metal layer. Optionally, in an embodiment, introducing the passivating species into the high-k gate dielectric layer through the first work function metal layer comprises using the n-type metal of the first work function metal layer to attract the radicals. Optionally, in an embodiment, introducing the passivating species is performed at a temperature of less than 100° C. Optionally, in an embodiment, the radicals are fluorine radicals, nitrogen radicals, or a combination thereof, and wherein the n-type metal is aluminum.

In accordance with yet another embodiment, a device comprises a semiconductor fin extending above an isolation region; a high-k gate dielectric layer over and extending along sidewalls of the semiconductor fin, the high-k gate dielectric layer comprising fluorine; and a gate stack over and along sidewalls of the high-k gate dielectric layer. The gate stack comprises a first work function metal layer comprising an n-type metal and fluorine; and a first fill metal layer over the first work function metal layer wherein the first fill metal layer is free of fluorine. Optionally, in an embodiment, the gate stack further comprises an adhesion layer under the first work function metal layer; a capping layer over the first work function metal layer; a barrier layer over the capping layer and under the first fill metal layer; and a second fill metal layer over the first fill metal layer, wherein the second fill metal layer comprises fluorine. Optionally, in an embodiment, a fluorine concentration of a portion of the high-k gate dielectric layer on a top surface of the semiconductor fin is in a range of 1.0 at % to 40.0 at %, and wherein a fluorine concentration of a portion of the high-k gate dielectric layer on a sidewall of the semiconductor fin is in a range of 1.0 at % to 40.0 at %. Optionally, in an embodiment, a fluorine concentration of a portion of the first work function metal layer on a top surface of the semiconductor fin is in a range of 1.0 at % to 40.0 at %, and wherein a fluorine concentration of a portion of the first work function metal layer on a sidewall of the semiconductor fin is in a range of 1.0 at % to 40.0 at %.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor fin extending above an isolation region;
   a high-k gate dielectric layer over and extending along sidewalls of the semiconductor fin, the high-k gate dielectric layer comprising fluorine; and
   a gate stack over and along sidewalls of the high-k gate dielectric layer, wherein the gate stack comprises:
      a first work function metal layer comprising an n-type metal and fluorine;
      a capping layer over the first work function metal layer, wherein the capping layer comprises the n-type metal, and wherein a concentration of the n-type metal in the capping layer decreases in a direction away from the first work function metal layer; and
      a first fill metal layer over the capping layer wherein the first fill metal layer is free of fluorine.

2. The device of claim 1, wherein the gate stack further comprises an adhesion layer between the first work function metal layer and the high-k gate dielectric layer.

3. The device of claim 1, wherein the gate stack further comprises a barrier layer between the capping layer and the first fill metal layer.

4. The device of claim 1, wherein the gate stack further comprises a second fill metal layer over the first fill metal layer, wherein the second fill metal layer comprises fluorine.

5. The device of claim 1, wherein a fluorine concentration of a portion of the high-k gate dielectric layer on a top surface of the semiconductor fin is in a range of 1.0 at % to 40.0 at %, and wherein a fluorine concentration of a portion of the high-k gate dielectric layer on a sidewall of the semiconductor fin is in a range of 1.0 at % to 40.0 at %.

6. The device of claim 1, wherein a fluorine concentration of a portion of the first work function metal layer on a top surface of the semiconductor fin is in a range of to at % to 40.0 at %, and wherein a fluorine concentration of a portion of the first work function metal layer on a sidewall of the semiconductor fin is in a range of 1.0 at % to 40.0 at %.

7. The device of claim 1, wherein the capping layer comprises fluorine.

8. The device of claim 1 further comprising a p-type work function metal layer between the first work function metal layer and the high-k gate dielectric layer.

9. The device of claim 1 further comprising an interfacial layer between the high-k gate dielectric layer and the semiconductor fin, wherein the interfacial layer comprises fluorine.

10. The device of claim 1 further comprising an interfacial layer between the high-k gate dielectric layer and the semiconductor fin, wherein the interfacial layer is free of fluorine.

11. A device comprising:
   a semiconductor substrate;
   a gate dielectric over the semiconductor substrate, wherein the gate dielectric comprises a high-k material and a passivating species, and wherein the passivating species is fluorine or nitrogen;
   a gate stack over the gate dielectric, wherein the gate stack comprises:
      a work function metal layer comprising aluminum and the passivating species;
      a capping layer over the work function metal layer, wherein the capping layer comprises aluminum and the passivating species, wherein a concentration of the aluminum in the capping layer decreases in a direction away from the work function metal layer; and
      a fill metal over the capping layer wherein the fill metal is free of the passivating species.

12. The device of claim 11, wherein the passivating species is fluorine.

13. The device of claim 11, wherein the passivating species is nitrogen, and wherein the work function metal layer has a greater than stoichiometric composition of nitrogen.

14. The device of claim 11, wherein a surface of the capping layer opposite to the work function metal layer is free of aluminum.

15. A device comprising:
   a semiconductor region;
   a high-k gate dielectric layer over and extending along sidewalls of the semiconductor region, the high-k gate dielectric layer comprising fluorine; and
   a gate stack over and along sidewalls of the high-k gate dielectric layer, wherein the gate stack comprises:
      an n-type work function metal layer comprising aluminum and fluorine;
      a capping layer over the n-type work function metal layer, wherein the capping layer comprises aluminum in at least a lower region of the capping layer, and wherein an upper region of the capping layer comprises aluminum at a lower concentration than the lower region of the capping layer;
      an adhesion layer over the capping layer; and
      a first fill metal over the adhesion layer wherein the first fill metal is free of fluorine.

16. The device of claim 15 further comprising a p-type work function between the n-type work function metal layer and the high-k gate dielectric layer.

17. The device of claim 15, wherein a surface of the capping layer opposite to the adhesion layer is free of aluminum.

18. The device of claim 15, further comprising a second fill metal over the first fill metal, wherein the second fill metal comprises fluorine.

19. The device of claim 15, wherein the n-type work function metal layer and the capping layer each further comprises titanium.

20. The device of claim 15, wherein the capping layer has a concentration of aluminum that gradually decreases from a bottom surface of the capping layer to a top surface of the capping layer.

* * * * *

UNITED STATES PATENT AND TRADEMARK OFFICE
CERTIFICATE OF CORRECTION

| | | |
|---|---|---|
| PATENT NO. | : 11,915,979 B2 | Page 1 of 1 |
| APPLICATION NO. | : 17/869326 | |
| DATED | : February 27, 2024 | |
| INVENTOR(S) | : Pei Ying Lai et al. | |

It is certified that error appears in the above-identified patent and that said Letters Patent is hereby corrected as shown below:

In the Claims

In Column 17, Line 54, Claim No. 6:
Change "the semiconductor fin is in a range of to at % to 40.0 at %" to --the semiconductor fin is in a range of 1.0 at % to 40.0 at %--

Signed and Sealed this
Seventh Day of May, 2024

Katherine Kelly Vidal
*Director of the United States Patent and Trademark Office*